(12) United States Patent
Sasaki

(10) Patent No.: US 8,063,703 B2
(45) Date of Patent: Nov. 22, 2011

(54) OUTPUT CIRCUIT OF RADIO-FREQUENCY TRANSMITTER

(75) Inventor: Takao Sasaki, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/700,865

(22) Filed: Feb. 5, 2010

(65) Prior Publication Data

US 2010/0201448 A1  Aug. 12, 2010

(30) Foreign Application Priority Data

Feb. 6, 2009 (JP) ................... 2009-026571

(51) Int. Cl.
*H03G 3/30* (2006.01)
(52) U.S. Cl. ....................... 330/278; 330/129
(58) Field of Classification Search ............ 330/278, 330/310–311, 133, 150, 98, 129
See application file for complete search history.

(56) References Cited

U.S. PATENT DOCUMENTS

| 5,862,460 | A | 1/1999 | Rich |
| 5,909,643 | A | 6/1999 | Aihara |
| 7,567,129 | B2 * | 7/2009 | Rohani et al. ............ 330/305 |
| 7,675,360 | B2 * | 3/2010 | Arai et al. ............... 330/129 |

FOREIGN PATENT DOCUMENTS

| JP | 9-148852 | 6/1997 |
| JP | 10-107654 | 4/1998 |
| JP | 11-205165 | 7/1999 |
| JP | 2000-261332 | 9/2000 |

* cited by examiner

*Primary Examiner* — Hieu Nguyen
(74) *Attorney, Agent, or Firm* — Fujitsu Patent Center

(57) ABSTRACT

An output circuit including a fine-adjustment VGA and a rough-adjustment VGA, where the maximum gain of the fine-adjustment VGA, as attained when the minimum gain of the rough-adjustment VGA is attained, is lower than the maximum gain of the fine-adjustment VGA as attained when the maximum gain of the rough-adjustment VGA is attained, so that the power consumption of the rough-adjustment VGA is reduced.

11 Claims, 16 Drawing Sheets

R - VGA

OUTPUT CIRCUIT OF RADIO-FREQUENCY TRANSMITTER

CROSS-REFERENCE TO RELATED APPLICATIONS

This application is based upon and claims the benefit of priority of the prior Japanese Patent Application No. 2009-26571, filed on Feb. 6, 2009, the entire contents of which are incorporated herein by reference.

FIELD

Embodiments as described herein relate to an output circuit of a radio-frequency transmitter, such as a high-frequency transmitter.

BACKGROUND

A high-frequency transmitter used for performing radio communications includes an output circuit configured to amplify an output signal into desired transmission power. The above-described output circuit includes an amplifier amplifying the output signal, and the amplifier includes a combination of a variable gain amplifier (hereinafter referred to as a VGA) amplifying a baseband signal and/or a low-frequency signal and a VGA amplifying a high-frequency signal obtained by up-converting the frequency of a signal output from the VGA, so that a large linear variable range is achieved.

The above-described combination including the two VGAs may be configured as below.

A first VGA amplifying a low-frequency signal and a second VGA amplifying a high-frequency signal obtained by up-converting the frequency of a signal output from the first VGA may be used in combination. Then, control is performed so that the gain of the first VGA is monotonously increased in steps of a single least-significant-bit (LSB) width, and control is performed so that the gain of the second VGA is gradually increased while being vibrated by as much as a single LSB width. Consequently, the entire gain control curve has a linear characteristic.

Further, a first VGA amplifying an intermediate-frequency signal, a mixer up-converting the frequency of an output of the first VGA, and a second VGA amplifying the high-frequency signal of an output of the mixer may be used in combination. Then, adjustments are made to obtain an intermediate-frequency signal having a distortion amount and a signal-to-noise ratio that are appropriate for the mixer when the gain amount of the first VGA corresponds to the maximum output level.

Further, a first VGA amplifying an intermediate-frequency signal and a second VGA amplifying a high-frequency signal obtained by up-converting the frequency of an output of the first VGA may be used in combination. Then, the gain of the first VGA is controlled so that the level of output power is changed over a lower range of the output power level, and the gain of the second VGA is controlled so that the output power level is changed over a higher range of the output power level.

Further, a VGA amplifying a high-frequency signal and a power amplifier amplifying an output of the VGA may be used in combination. At the small-output transmission time, the power amplifier is turned off and bypassed.

A high-frequency transmitter should be configured so that noise output power attained outside the signal band at the maximum-power output time is limited to less than a specified value so as to reduce an influence on a different system and/or an adjacent channel due to the specifications thereof. For example, it is specified that noise power away from the signal band by as much as X Hz becomes −30 dBm or less when an output of the signal band becomes 20 dBm. In that case, the power ratio of a signal to the noise power (the carrier to noise (CN) ratio) is expressed by the equation 20 dBm−(−30 dBm) =50 dB.

Under the above-described limitations imposed by the specifications, the amplitude of a baseband signal and/or a low-frequency signal is increased so that the ratio of signal power to noise power (the CN ratio) is sufficiently increased. Further, amplification is performed through a VGA provided in the post stage so that desired transmission power is achieved. In that case, the VGA provided in the preceding stage to amplify the baseband signal and/or the low-frequency signal should be configured so that the CN ratio is sufficiently increased even though the VGA is controlled to attain the minimum gain. This is because the CN ratio of an output should satisfy the standard even though the VGA provided in the post stage is controlled to attain the maximum gain at the same time as when the VGA provided in the preceding stage is controlled to attain the minimum gain and a total of the gains becomes the maximum gain area.

However, when the level of the minimum gain of the VGA provided in the preceding stage is increased to such an extent that the above-described standard is satisfied, the level of the maximum gain of the VGA provided in the preceding stage becomes higher than the above-described level. Consequently, when the VGA provided in the preceding stage is controlled to attain the maximum gain when the VGA provided in the post stage attains a low gain, a signal with a large amplitude is input to the VGA provided in the post stage, so that a signal output from the post-stage VGA attaining the low gain is distorted and the communication quality is deteriorated.

SUMMARY

According to aspects of various embodiments described herein, there is provided an output circuit of a high-frequency transmitter that includes: a first variable gain amplifier configured to change and control a gain within a first gain variable range based on a first variable width and to amplify an input signal; a second variable gain amplifier configured to amplify a signal provided for an output of the first variable gain amplifier, where a gain is changed and controlled within a second gain variable range larger than the first gain variable range based on a second variable width larger than the first variable width; and a gain control unit configured to control a gain including the gain of the first variable gain amplifier and the gain of the second variable gain amplifier by fluctuating the gain of the second variable gain amplifier in steps of the second variable width in response to fluctuations of the gain of the first variable gain amplifier, the fluctuations being attained within the first gain variable range, wherein the gain control unit performs control so that a maximum gain attained within the first gain variable range of the first variable gain amplifier when the gain of the second variable gain amplifier is controlled to be a minimum gain becomes lower than a maximum gain attained within the first gain variable range of the first variable gain amplifier when the gain of the second variable gain amplifier is controlled to be a maximum gain.

It is to be understood that both the foregoing summary description and the following detailed description are exemplary and explanatory and are not restrictive of the invention, as claimed.

DESCRIPTION OF EMBODIMENTS

Figure 1:
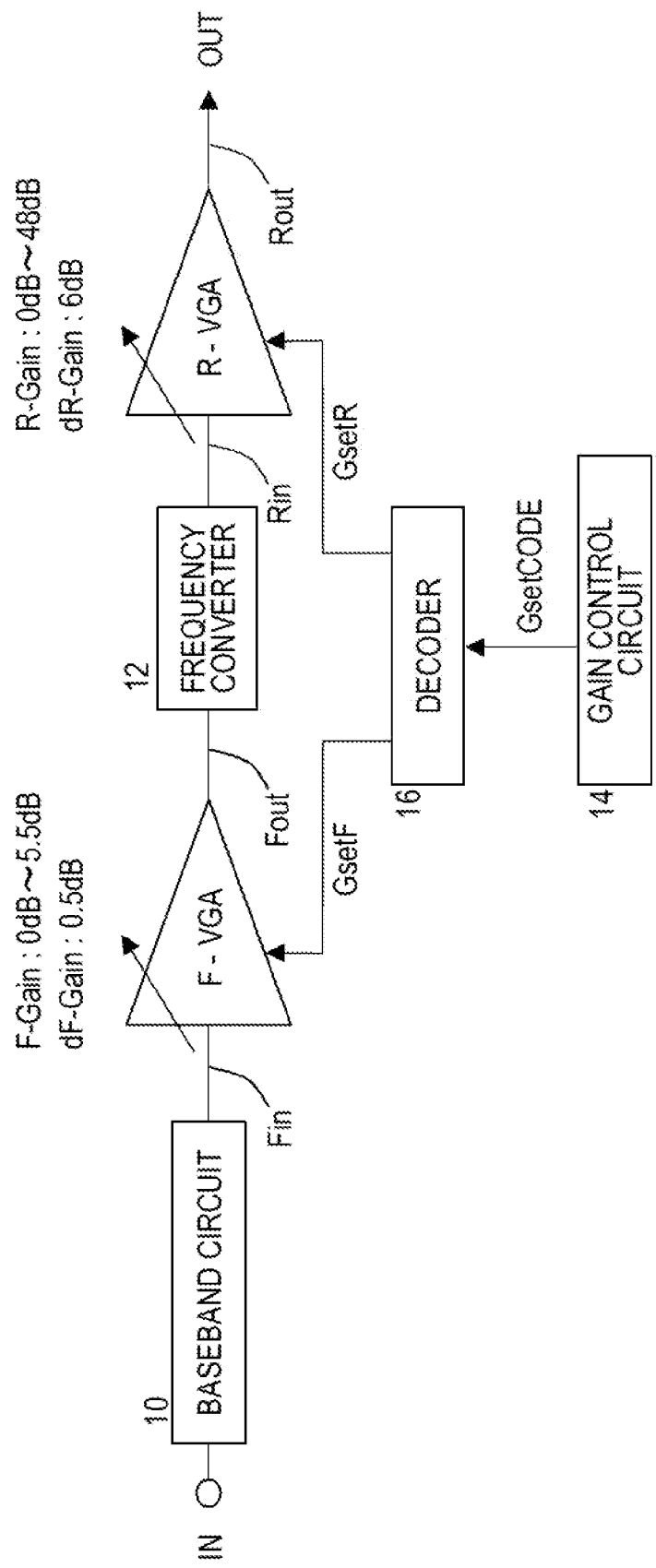
FIG. 1 illustrates an exemplary output circuit of a radio-frequency (RF) transmitter according to an embodiment of the present invention.

FIG. 1 illustrates an exemplary output circuit of a radio-frequency transmitter, such as a high-frequency transmitter, according to an embodiment of the present invention. The above-described output circuit includes a baseband circuit 10 performing modulation, code spreading, and so forth for an input signal IN including transmission data or the like, a fine-adjustment variable gain amplifier F-VGA configured to amplify a first frequency signal Fin including a baseband signal and/or a low-frequency signal, a frequency converter 12 configured to up-convert the frequency of an output signal Fout of the fine-adjustment variable gain amplifier F-VGA, and a rough-adjustment variable gain amplifier R-VGA configured to amplify a second frequency signal Rin including a high frequency signal obtained through the up-conversion. An output signal Rout of the rough-adjustment variable gain amplifier R-VGA is transmitted as a high-frequency output signal OUT via an antenna (not shown), for example.

Further, the output circuit includes a gain control circuit 14 configured to output a gain setting code GsetCODE provided for a gain to be controlled and a decoder 16 configured to decode the gain setting code GsetCODE and to output gain setting signals GsetF and GsetR to the two amplifiers F-VGA and R-VGA individually. The gain control circuit 14 appropriately generates the gain setting code GsetCODE to control the gain of each of the two amplifiers F-VGA and R-VGA so that the high-frequency output signal OUT becomes desired power.

FIG. 1 exemplarily illustrates the 0 dB-to-5.5 dB gain variable range and the variable width (or gain increment) thereof indicated by the expression dF-Gain=0.5 dB that correspond to a gain F-Gain shown for the fine-adjustment variable gain amplifier F-VGA. Likewise, FIG. 1 exemplarily illustrates the 0 dB-to-48 dB gain variable range and the variable width thereof indicated by the expression dR-Gain=6 dB that correspond to a gain R-Gain shown for the rough-adjustment variable gain amplifier R-VGA. The variable width dF-Gain of the fine-adjustment amplifier F-VGA is smaller than the variable width dR-Gain of the rough-adjustment amplifier R-VGA. Likewise, the gain variable range of the gain F-Gain of the fine-adjustment amplifier F-VGA is smaller than that of the gain R-Gain of the rough-adjustment amplifier R-VGA. In the above-described embodiment, the 0 dB-to-5.5 dB gain variable range of the gain F-Gain of the fine-adjustment amplifier F-VGA corresponds to the variable width dR-Gain=6 dB of the rough-adjustment amplifier R-VGA. Further, in the above-described embodiment, the fine-adjustment gain F-Gain is controlled to have twelve levels, and the rough-adjustment gain R-Gain is controlled to have nine levels.

Each time the gain R-Gain of the rough-adjustment amplifier R-VGA is increased and/or decreased based on the variable width dR-Gain, the gain F-Gain of the fine-adjustment amplifier F-VGA is increased and/or decreased in steps of the fine-adjustment variable width dF-Gain within the gain variable range. Consequently, the gain control can be attained in steps of the small variable width dF-Gain over a large range, that is, the 0 dB-to-48 dB gain variable range of the rough-adjustment amplifier R-VGA. For example, the rough-adjustment gain R-Gain is controlled to have a value of 24 dB and the fine-adjustment gain F-Gain is controlled to have a value of 2.5 dB, the total of the gains is shown by the equation 24+2.5=26.5 dB.

The fine-adjustment amplifier F-VGA is a circuit configured to amplify a signal Fin including a baseband signal and/or a low-frequency signal, whereas the rough-adjustment amplifier R-VGA is a circuit configured to amplify a high-frequency signal Rin. Since the frequency bands of the signals amplified through the individual amplifiers are different from each other, each of the amplifiers has a circuit configuration provided for the frequency band.

Figure 2:
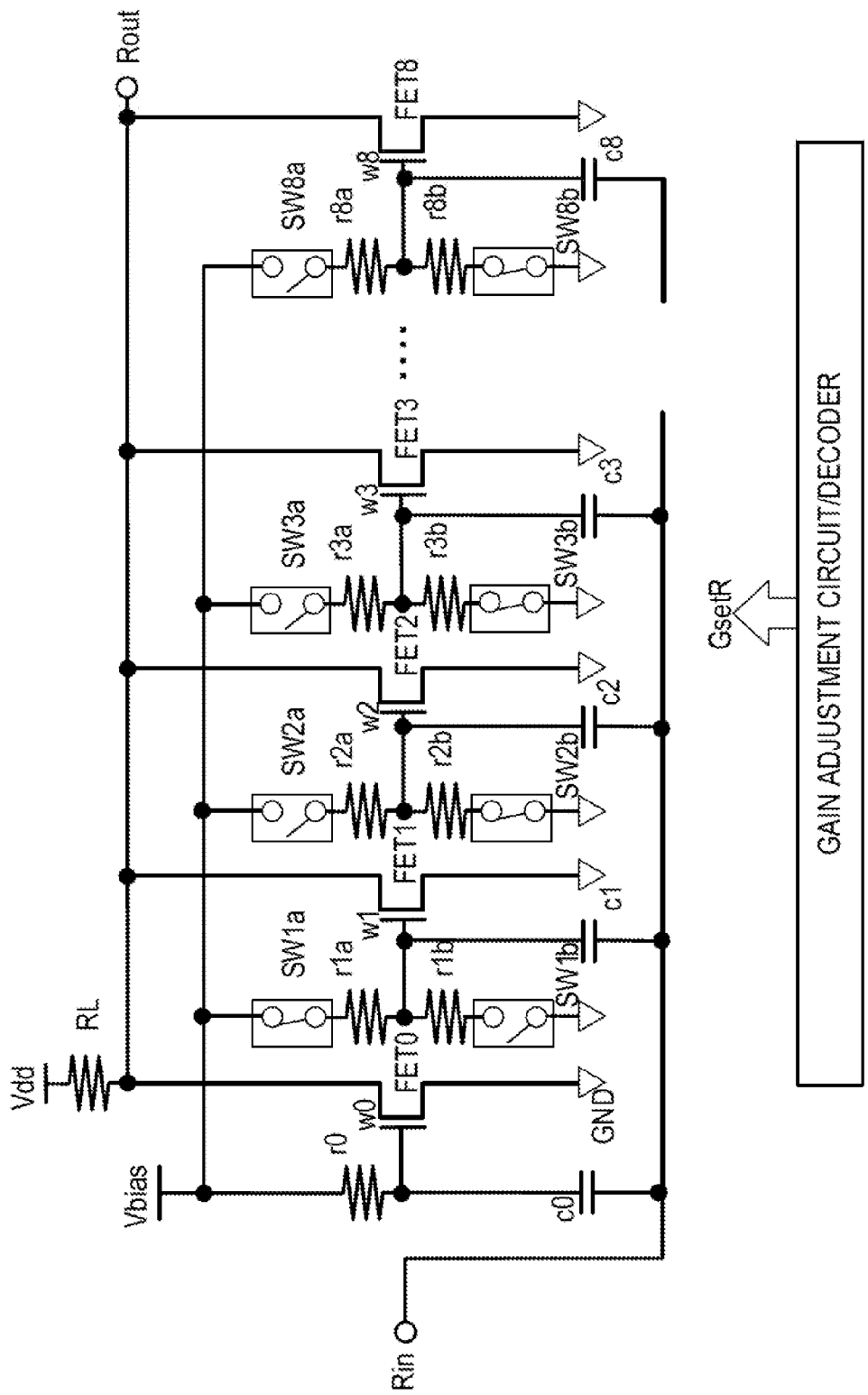
FIG. 2 illustrates a circuit diagram of a rough-adjustment variable gain amplifier R-VGA according to an embodiment of the present invention.

FIG. 2 illustrates a circuit diagram of the rough-adjustment variable gain amplifier R-VGA according to an embodiment of the present invention. The rough-adjustment amplifier R-VGA includes nine source grounding transistors FET0 to FET8 that are connected in parallel with one another, where an input signal Rin is supplied to each of the gates thereof via capacitors c0 to c8, and an output signal Rout is generated on the drain side. Load resistors RL are provided between a power voltage Vdd and the source grounding transistors on the drain side. Further, a gate bias voltage Vbias is applied to each of the gates of the transistors FET0 to FET8 via resistors r0 and r1a to r8a.

The gate bias voltage Vbias is applied to the transistor FET0 at all times so that the transistor FET0 is enabled at all times. As for the other transistors FET1 to FET8, switches SW1a to SW8a are individually provided between the gates and a gate bias voltage Vbias, and switches SW1b to SW8b are individually provided between the gates and grounds GND. Each of the above-described switches is on-off controlled through a gain setting signal GsetR transmitted from a gain adjustment circuit and a decoder. When each of the switches SW1a to SW8a is turned on, the transistor FET corresponding to the switch is enabled to amplify an input signal. However, when each of the switches SW1b to SW8b is turned on, the transistor FET corresponding to the switch is disabled so that the input signal-amplifying operation is not performed. The disabled transistor conducts no electricity and consumes no currents, and the enabled transistor conducts electricity, generates a drain current based on the input signal Rin, and generates and transmits an amplified signal to the output end Rout provided on the drain side.

The gate widths W0 to W8 of the transistors FET0 to FET8 are different from one another. For example, in comparison with the gate width w0 of the transistor FET0 which is enabled at all times, the other gate widths are designed so that the equations $w1=w0$, $w2=2*w1$, $w3=2*w2$, ... $wi=2*wi-1$ ... $w8=2*w7$ hold. For example, when the gate width w0 may be indicated by the equation $w0=3$, the values of w1 to w8 may be individually shown as 3, 6, 12, 24, 48, 96, 192, 384, and 768. Further, since the gate current is doubled for the addition of another enabled transistor, the gain thereof is increased by as much as 6 dB (gain: $20*\log 2=6$ dB) at a time. When being formed into a large-scale integrated (LSI) circuit, each of the transistors FET includes transistor units provided in parallel, where the gate width of each of the transistor units is minimized. Then, the gate widths w0 to w8 of the transistors are attained based on the number of the transistor units with the minimized gate widths, where the transistor units are provided in parallel.

The gain is increased as the gate width of the enabled transistor is increased. Further, linear amplification may be attained even though the input signal Rin has high power. Therefore, the gate width w0 of the reference transistor FET0 is set in consideration of the maximum power of the input signal Rin. Then, in comparison with the gate width w0, each of the gate widths w1 to w8 of the other transistors has the above-described ratio. Namely, when the gate width of the reference transistor FET0 is decreased, the gate widths of the other transistors are decreased so that the power consumption is reduced.

Here, gate grounding transistors may be cascaded between the drains of the source grounding transistors FET0 to FET8 and the output end Rout. When the gate grounding transistors are cascaded, a gate bias voltage is supplied to each of the source grounding transistors and a switch provided to supply the gate bias voltage to the gate grounding transistor is on-off controlled so that the enable state and the disable state of the gate grounding transistor are controlled.

Figure 3:
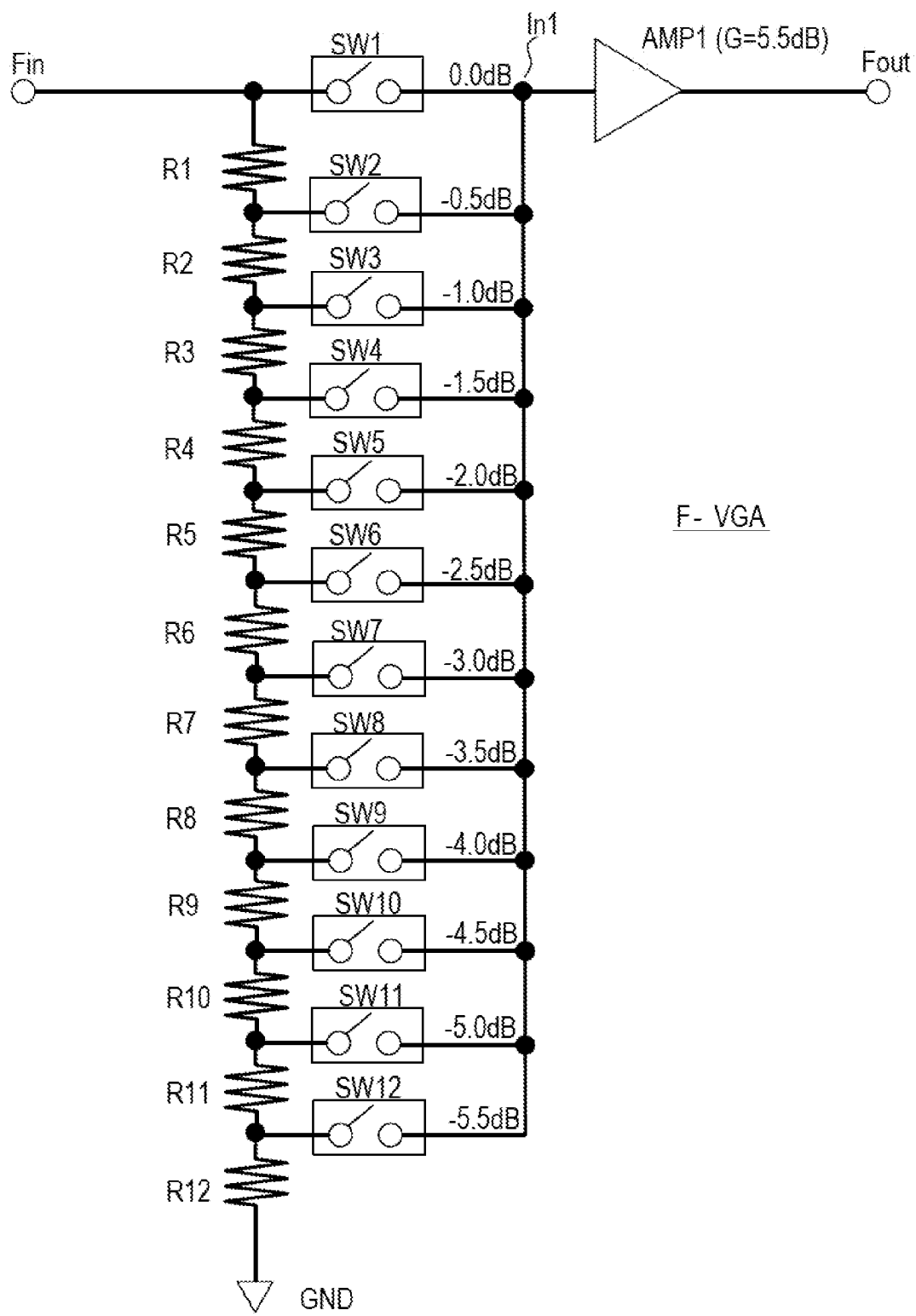
FIG. 3 illustrates a circuit diagram of a fine-adjustment variable gain amplifier F-VGA according to an embodiment of the present invention.

FIG. 3 illustrates a circuit diagram of the fine-adjustment variable gain amplifier F-VGA according to an embodiment of the present invention. The above-described amplifier F-VGA includes a group of series resistors R1 to R12 provided between an input end to which the input signal Fin is input and a ground GND, an operational amplifier AMP1 configured to amplify a signal obtained by performing resistor division for the input signal Fin, an output end provided to output an output signal Fout of the operational amplifier 1, and a group of switches SW1 to SW12 provided between the connection points of the series resistor group and an input node In1 of the operational amplifier. The above-described switches are on-off controlled through a gain setting signal GsetF transmitted from a gain adjustment circuit and a decoder. Then, when one of the group of switches is controlled and turned on, the other switches are controlled and turned off, and a gain signal shown in FIG. 3 is output as an output signal Fout for the switch which is controlled and turned on. Namely, the input node In1 of the operational AMP1 is subjected to the resistor division through the group of resistors R1 to R12, where each of the resistors R1 to R12 is designed to have an appropriate resistance value. Consequently, the gain signal shown in FIG. 3 is generated. According to FIG. 3, the operational amplifier AMP1 is designed to have a gain of 5.5 dB, and a gain signal which is varied based on a variable width of 0.5 dB within the 0 dB-to-5.5 dB range through the resistor division is generated.

The input signal Fin is a baseband signal and/or a low-frequency signal. In that case, the gain control may be performed with high precision through a passive element such as a resistor. On the contrary, if the input signal Fin is a high-frequency signal such as the input signal Rin of the rough-adjustment amplifier R-VGA, the parasitic capacitance and/or the parasitic inductance of the passive element becomes an impedance component for the high-frequency signal, which makes it difficult to perform the gain control with high precision. In that respect, the gain control attained by changing the transistor size, as shown in FIG. 2, is appropriate for a circuit configured to amplify a high frequency signal.

Since the input signal Fin is the baseband signal and/or the low-frequency signal, the operation amplifier may be a widely available amplifier including an input resistor and a feedback resistor, for example.

Figure 4:
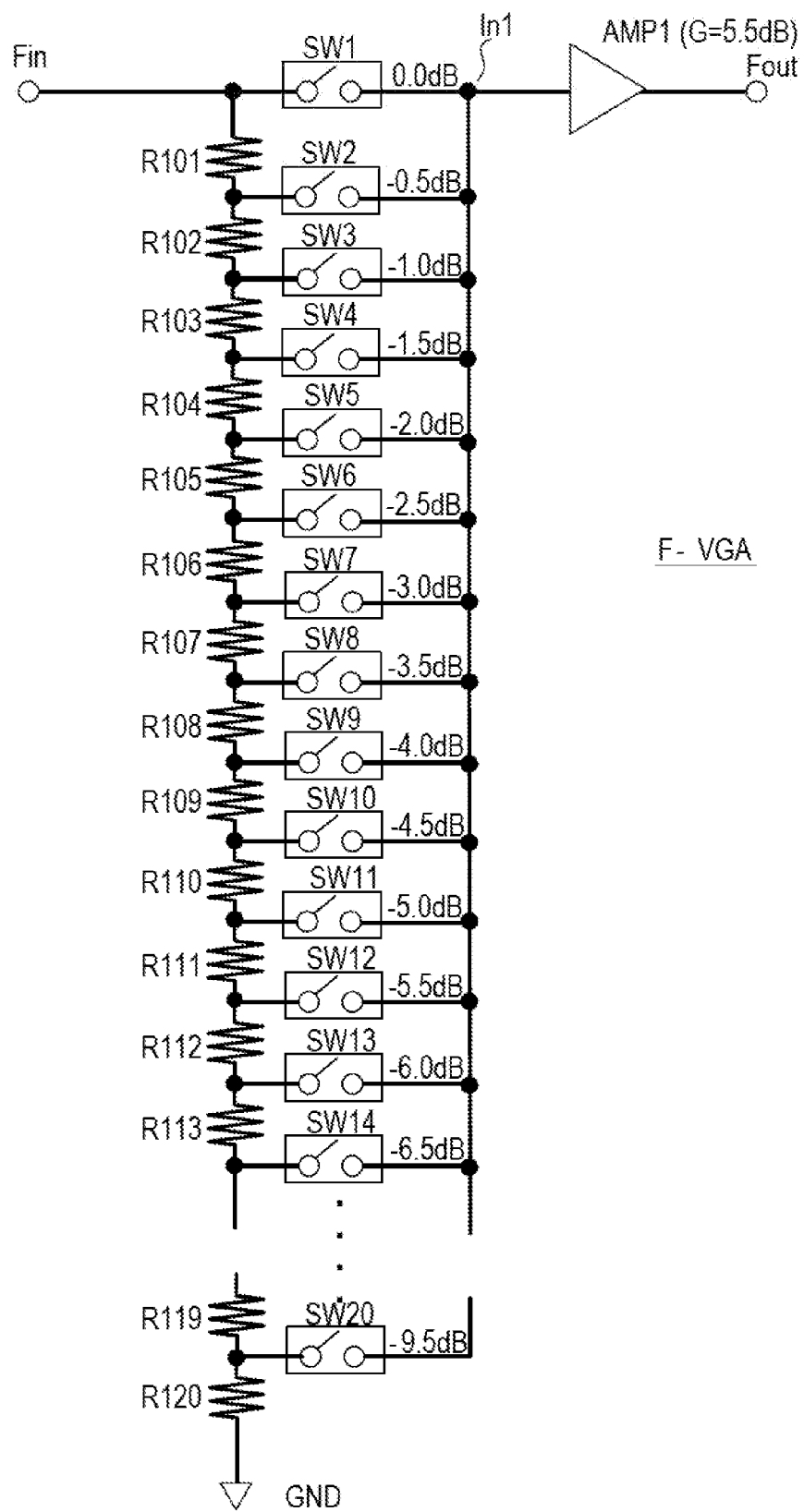
FIG. 4 illustrates another circuit diagram of the fine-adjustment variable gain amplifier F-VGA.

FIG. 4 illustrates another circuit diagram of the fine-adjustment variable gain amplifier according to the above-described embodiment. As is the case with the circuit shown in FIG. 3, the amplifier F-VGA includes a group of series resistors R101 to R120 provided to perform the resistor division for the input signal Fin, an operational amplifier AMP1 configured to amplify a signal obtained through the resistor division, and a group of switches SW1 to SW20 provided between the connection points of the series resistor group and the input node In1 of the operational amplifier AMP1. The number of the series resistors and the number of the switches are larger than those of the circuit shown in FIG. 3. As a result, the number of types of output table gains is increased to twenty in total in increments of 0.5 dB within the −4.0 dB-to-5.5 dB range. The other configurations are equivalent to those of FIG. 3. The gain control performed through the fine-adjustment amplifier F-VGA shown in each of FIGS. 3 and 4 will be described in detail in the following specific examples.

Figure 5:
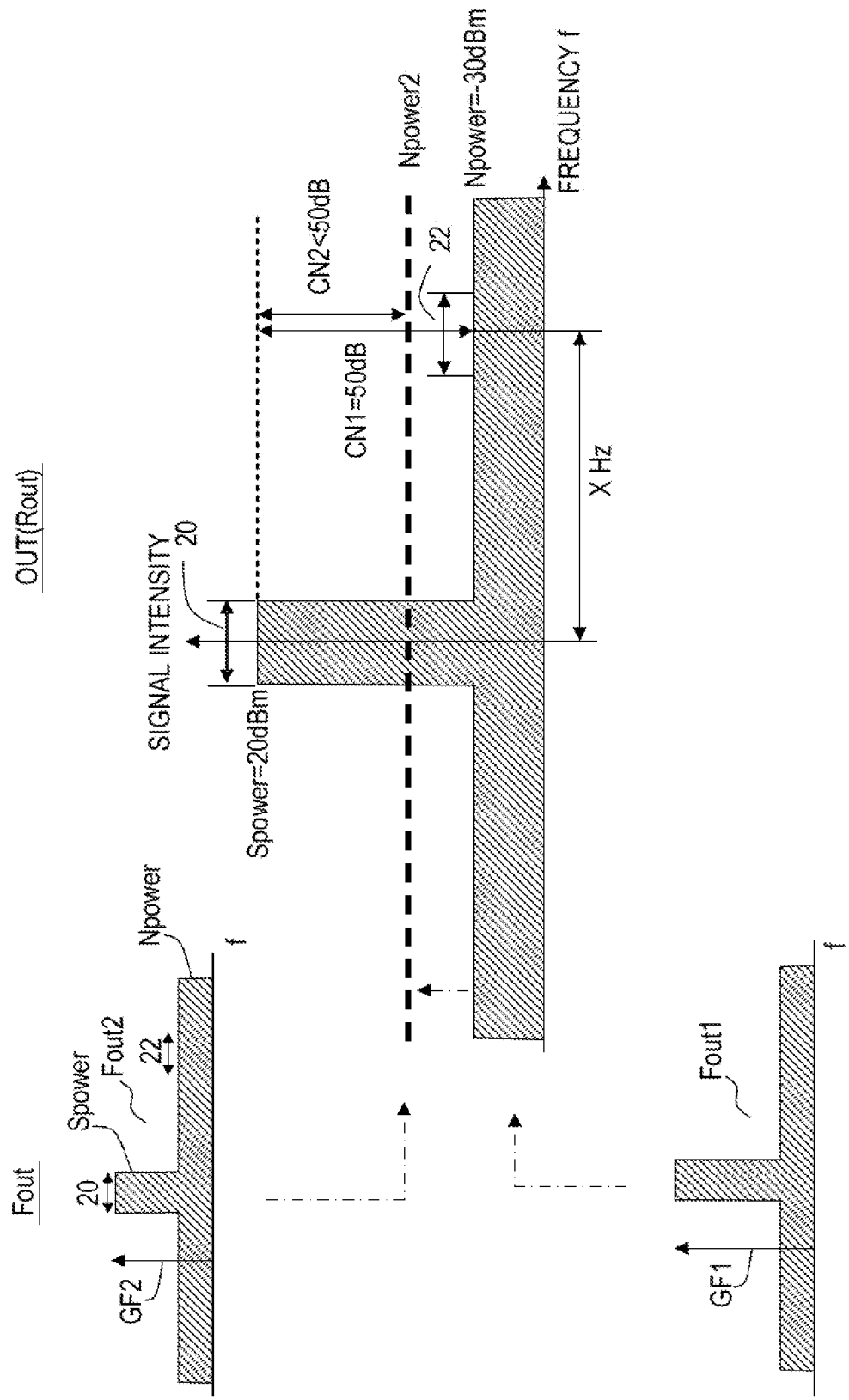
FIG. 5 illustrates the CN ratio of an output signal of the output circuit of the RF transmitter.

FIG. 5 illustrates the CN ratio of an output signal of the output circuit of the transmitter. In FIG. 5, the relationship between the signal power and the noise power of an output signal OUT of the output circuit (corresponding to the output signal Rout of the rough-adjustment amplifier shown in FIG. 1) is shown on the right side, and the relationship between the signal power and the noise power of the output signal Fout of the fine-adjustment amplifier F-VGA is shown on the left side. On either side, the lateral axis indicates the frequency and the vertical axis indicates the signal intensity (signal power).

According to radio-communication transmitters, noise output power Npower attained outside the signal band at the maximum-power output time is limited to less than a predetermined value due to the specifications so as to reduce an influence on a different system and/or an adjacent channel. When the maximum power is output, the variable gain amplifier is controlled to attain the maximum gain. In that case, the value of signal power Spower attained within a signal band 20 is maximized and that of the noise output power Npower is also maximized.

According to FIG. 5, it is specified that the noise power generated in a band 22 away from the signal band 20 by as much as X Hz becomes −30 dBm or less when the output power Spower attained in the signal band 20 is 20 dBm. Consequently, the power ratio of the signal to the noise power (CN ratio) is shown as the expression 20 dBm−(−30 dBm)= 50 dB. Further, since 1 mW of power is represented as 0 dBm, 20 dBm is 100 mW of power and −30 dBm is 1/1000 mW of power so that the difference therebetween becomes 10 raised to the 5th power.

In FIG. 5, the relationship between the signal power and the noise power of the output signal Fout of the fine-adjustment amplifier F-VGA, which is attained in each of the case where the gain is achieved as a small gain GF1 and the case where the gain is achieved as a large gain GF2, is shown on the left side. Although the signal power Spower attained in the center is increased as the gain is increased, the heat noise Npower generated from the circuit of the amplifier F-VGA has substantially constant power. Therefore, since the signal intensity is increased as the gain is increased, the signal to noise (SN) ratio of the output signal Fout may be increased.

The frequency of the output signal Fout of the fine-adjustment amplifier is up-converted and the output signal Fout is amplified through the rough-adjustment amplifier R-VGA which amplifies the output signal Fout and the noise of the fine-adjustment amplifier F-VGA equally and adds the heat noise of the circuit of the rough-adjustment amplifier. The heat noise also occurs in the frequency converter 12 which up-converts the frequency.

At all events, the CN ratio of the maximum signal power to the noise output power, the CN ratio being appropriate for the transmitter, should be reduced to less than a specified value so as to reduce the noise output power generated outside the signal band to less than a specified value when the transmitter outputs the maximum power.

Due to the above-described limitations imposed by the specifications, an amplifier circuit including the fine-adjustment amplifier F-VGA and the rough-adjustment amplifier R-VGA that are shown in FIG. 1 should be configured that the output signal amplitude corresponding to the minimum gain of the fine-adjustment amplifier F-VGA is increased so that the CN ratio of an output signal of the amplifier circuit is sufficiently increased. The output signal Fout of the fine-adjustment amplifier F-VGA is amplified to appropriate transmission power through the rough-adjustment amplifier R-VGA provided in the post stage due to the following reasons. Originally, when the CN ratio of the output signal Fout of the fine-adjustment amplifier F-VGA is small, the CN ratio of the output signal Rout of the rough-adjustment amplifier R-VGA is not improved to be better than that of the output signal Fout of the fine-adjustment amplifier F-VGA and the specifications are not satisfied. Consequently, even though the fine-adjustment amplifier F-VGA is controlled to attain the minimum gain, the CN ratio should be increased sufficiently.

In FIG. 5, noise power Npower2 attained in the case where the rough-adjustment amplifier amplifies the output signal Fout2 corresponding to the small gain GF2 becomes larger than the noise power Npower (−30 dBm) attained in the case where the rough-adjustment amplifier amplifies the output signal Fout1 corresponding to the large gain GF1 with reference to the same signal intensity Spower, as indicated by a broken line. Namely, the CN ratio CN2 of the output signal OUT corresponding to the gain GF2 attained for fine adjustment becomes smaller than the CN ratio CN1=50 dB of the output signal OUT corresponding to the gain GF1 attained for fine adjustment.

Figure 6:
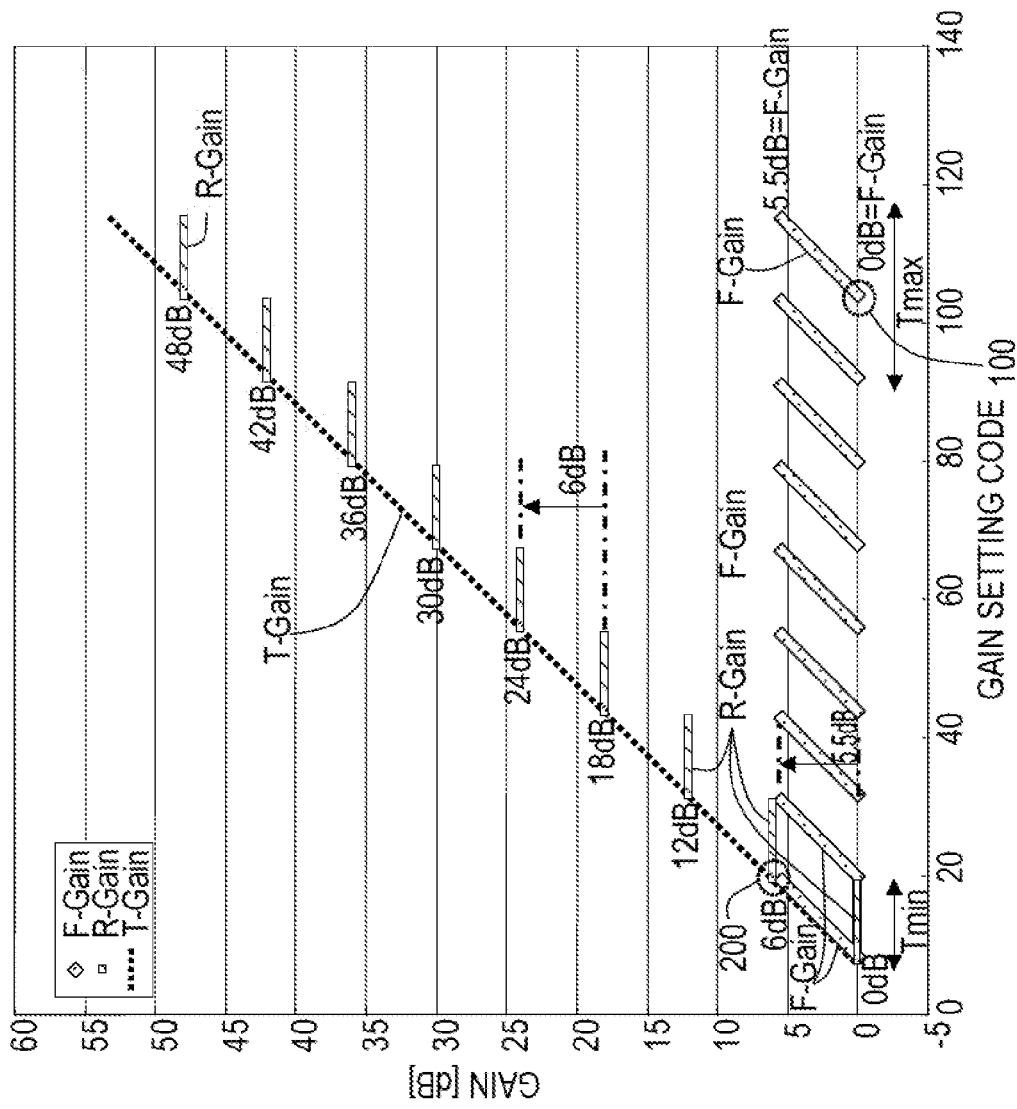
FIG. 6 illustrates the gain control characteristic of each of the fine-adjustment amplifier and the rough-adjustment amplifier that are shown in FIG. 1.

FIG. 6 illustrates the gain control characteristic of each of the fine-adjustment amplifier and the rough-adjustment amplifier that are shown in FIG. 1. The above-described gain control characteristic is an exemplary gain control characteristic compared to a gain control characteristic according to another embodiment of the present invention, where the embodiment will be described later. In FIG. 6, gain setting codes generated through the gain control circuit are associated with the lateral axis and gains are associated with the vertical axis. Further, the gain F-Gain of the fine-adjustment amplifier and the gain R-Gain of the rough-adjustment amplifier, which are controlled based on the gain setting code, and the total gain T-Gain are shown. As illustrated in FIG. 1, the gain R-Gain attained on the rough-adjustment side is controlled in steps of the variable width of 6 dB within the 0 dB-to-48 dB gain variable range. On the other hand, the gain F-Gain attained on the fine-adjustment side is controlled in steps of the variable width of 0.5 dB within the 0 dB-to-5.5 dB gain variable range. As a result, the total gain T-Gain is controlled in steps of a variable width of 0.5 dB within the 0 dB-to-53.5 dB gain variable range.

Figure 7:
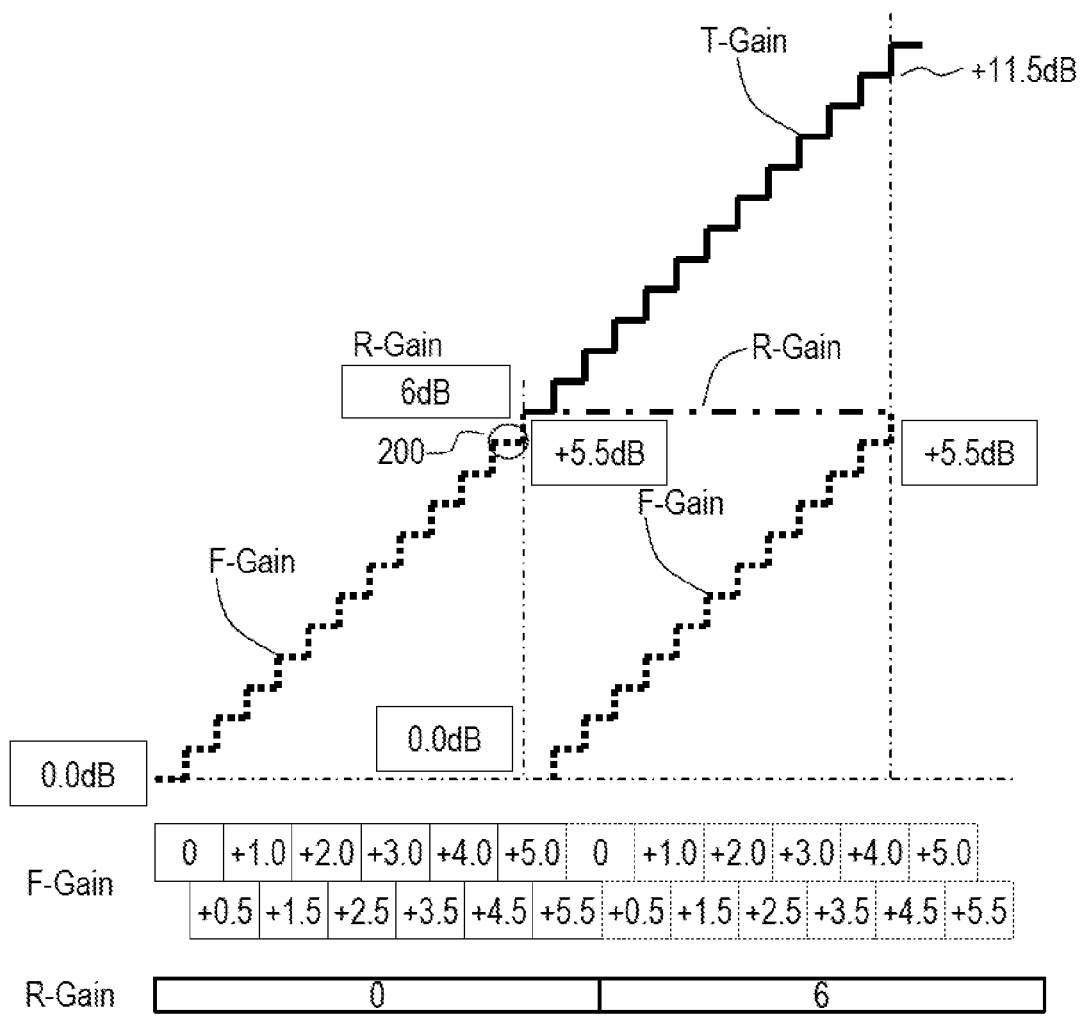
FIG. 7 illustrates the gain control characteristic shown in FIG. 6 in detail.
Figure 8:
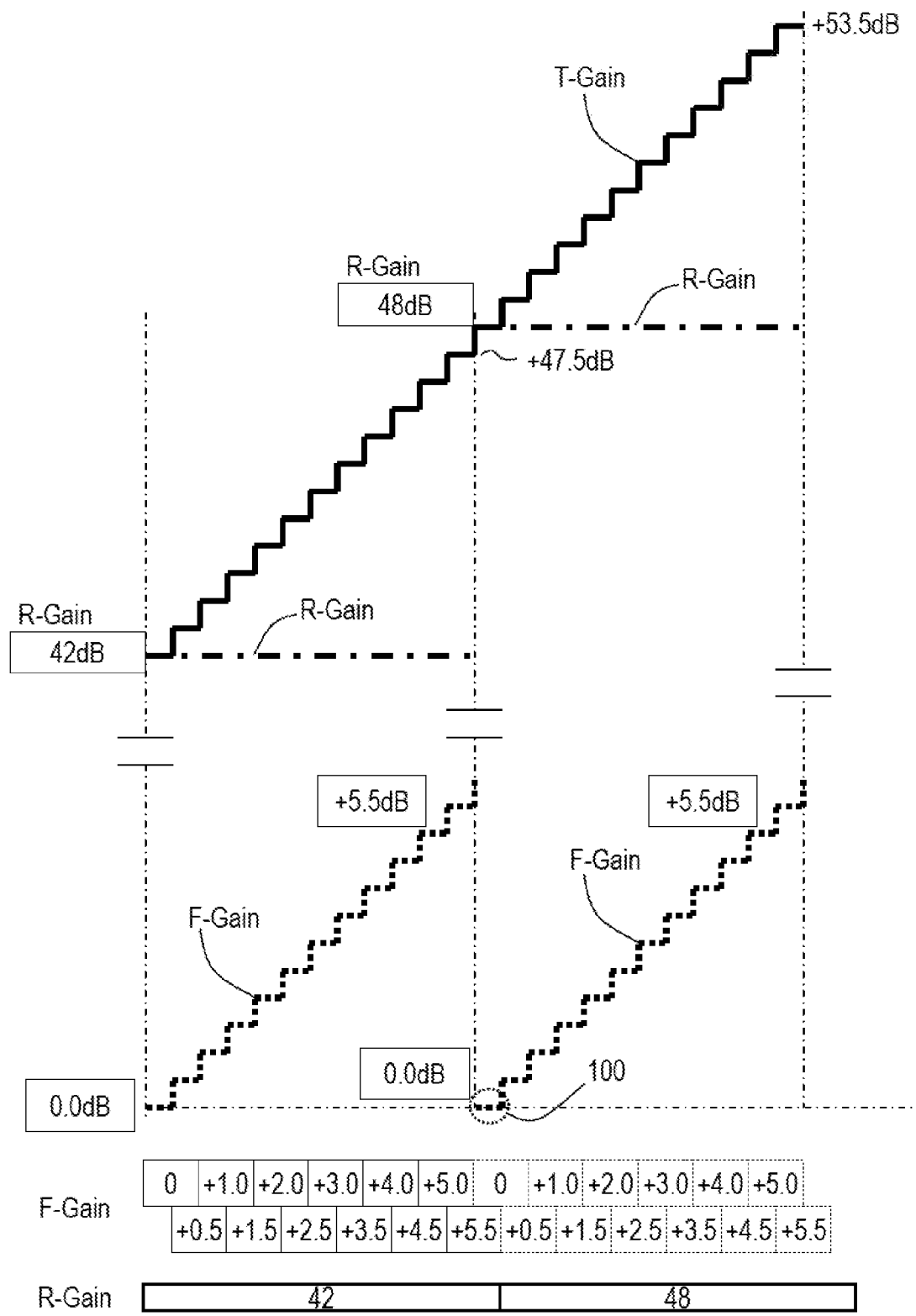
FIG. 8 illustrates the gain control characteristic shown in FIG. 6 in detail.

Each of FIGS. 7 and 8 illustrates the details of the gain control characteristic shown in FIG. 6. FIG. 7 illustrates the case where the total gain T-Gain shown in FIG. 6 is minimized and the FIG. 8 illustrates the case where the total gain T-Gain shown in FIG. 6 is maximized in detail. When the total gain T-Gain shown in FIG. 7 falls within the 0 dB-to-5.5 dB range, the rough-adjustment gain R-Gain is controlled to have a value of 0 dB and the gain F-Gain attained on the fine-adjustment side is controlled on a scale of twelve in steps of the variable width of 0.5 dB within the 0 dB-to-5.5 dB range. Likewise, when the total gain T-Gain is controlled to fall within the 6 dB-to-11.5 dB range, the gain F-Gain attained on the fine-adjustment side is controlled on a scale of twelve in steps of the variable width of 0.5 dB within the 0 dB-to-5.5 dB range. When the total gain T-Gain is increased from 5.5 dB to 6.0 dB, the gain R-Gain attained on the rough-adjustment side is increased from 0 dB to 6 dB and the gain F-Gain attained on the fine-adjustment side is decreased from 5.5 dB to 0 dB. On the other hand, when the total gain T-Gain is decreased from 6.0 dB to 5.5 dB, the gain R-Gain attained on the rough-adjustment side is decreased from 6 dB to 0 dB and the gain F-Gain attained on the fine-adjustment side is increased from 0 dB to 5.5 dB.

Although the total gain T-Gain shown in FIG. 8 falls within the 42 dB-to-53.5 dB range, the relationship between the R-Gain attained on the rough-adjustment side and the gain F-Gain attained on the fine-adjustment side remains substantially the same.

Thus, according to the comparison examples shown in FIGS. 6, 7, and 8, the variable range of the fine-adjustment gain F-Gain remains substantially the same, that is to say, corresponds to the 0 dB-to-5.5 dB range at all times, and the variable width of 6 dB of the rough-adjustment gain R-Gain corresponds to the variable range of the rough-adjustment gain.

During the above-described gain control, a control point 100 where the fine-adjustment gain F-Gain is controlled and minimized in the case where the total gain T-Gain is controlled to fall within the maximum gain range $T_{max}$ (shown in FIG. 6) and a control point 200 where the fine-adjustment gain F-Gain is controlled and maximized in the case where the rough-adjustment gain R-Gain is minimized and/or falls within the minimum gain range Tmin become factors in the characteristic of the output circuit.

First, the control point 100 will be described. The total gain T-Gain shown in FIG. 6 is controlled to fall within the maximum range Tmax at any point so that the output of the output circuit is controlled and becomes the maximum power. Since the control gain controlled to become the maximum output power is varied due to variations in the circuit characteristic and/or the operating environment of the amplifier, the total gain T-Gain has any value attained within the maximum gain range Tmax. Therefore, it is conceivable that the maximum output power may be generated when the fine-adjustment gain F-Gain becomes the minimum gain of 0 dB within the maximum range Tmax. Further, when the maximum output power is generated, the limitations imposed by the specifications take the form of the CN ratio exceeding the predetermined specified value and the CN ratio of the output signal Fout of the fine-adjustment amplifier F-VGA, the CN ratio exceeding the predetermined specified value, as illustrated in FIG. 5. Therefore, for making the CN ratio of the output signal Fout of the fine-adjustment amplifier F-VGA exceed the specified value even though the fine-adjustment amplifier F-VGA is controlled to attain the minimum gain, as indicated by the control point 100, for example, the minimum value of the fine-adjustment gain F-Gain should be increased sufficiently.

On the other hand, at a control point 200 where the fine-adjustment gain F-Gain is controlled and maximized in the case where the rough-adjustment gain R-Gain is minimized and/or falls within the minimum gain range Tmin, only the reference transistor FET0 of the rough-adjustment amplifier R-VGA shown in FIG. 2 is enabled. Therefore, the value of the gate width of the amplifier transistor is minimized and it is conceivable that a signal amplified through the amplifier R-VGA may include a distortion when the input signal Rin has an excessive amplitude. Consequently, the gate width of the reference transistor FET0 should be increased to such an extent that the signal may be amplified without a distortion even though the value of the fine-adjustment F-Gain is maximized.

Then, as the variable width of the rough-adjustment amplifier R-VGA is kept substantially constant at 6 dB (doubled), the gain variable range of the fine-adjustment amplifier F-VGA is also kept substantially constant. As a result, if the minimum gain of the fine-adjustment amplifier F-VGA is set to a slightly high value in consideration of the control point 100, the maximum gain of the fine-adjustment amplifier F-VGA, the maximum gain being attained at the control point 200, is also increased, and the amplitude of the output signal Fout is increased. Consequently, the size of the reference transistor FET0 of the rough-adjustment amplifier R-VGA is increased so that the size of each of the other transistors FET1 to FET8 is increased as well. As a result, the circuit scale and the power consumption are increased.

First Embodiment

Figure 9:
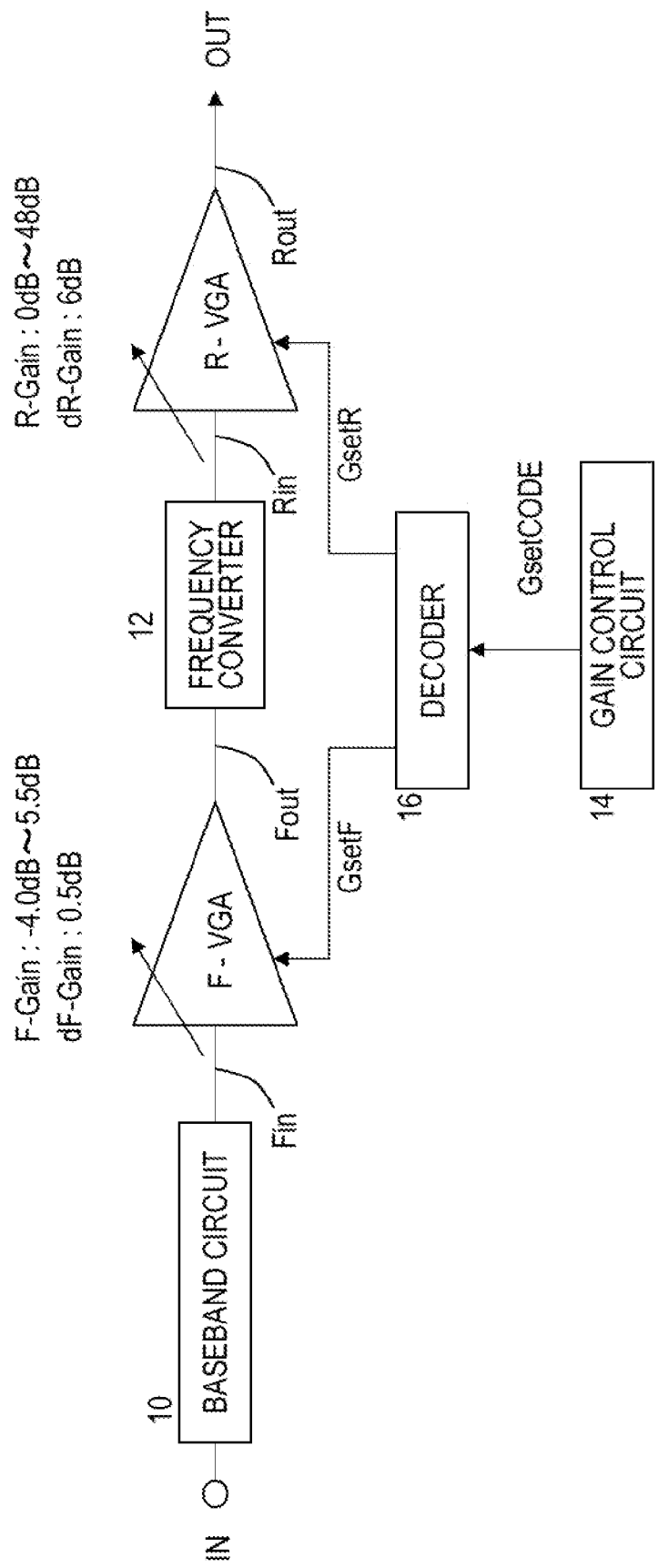
FIG. 9 illustrates an output circuit of a RF transmitter according to a first embodiment of the present invention.

FIG. 9 illustrates an output circuit of a RF transmitter according to a first embodiment of the present invention. As is the case with FIG. 1, the above-described output circuit includes the baseband circuit 10, the fine-adjustment variable gain amplifier F-VGA, the frequency converter 12, and the rough-adjustment variable gain amplifier R-VGA. Further, the output circuit includes the gain control circuit 14 configured to output the gain setting code GsetCODE, and the decoder 16 configured to decode the gain setting code GsetCODE and to output the gain setting signals GsetF and GsetR to the two amplifiers F-VGA and R-VGA individually.

According to the example shown in FIG. 9, the gain F-Gain shown for the fine-adjustment variable gain amplifier F-VGA has the −4 dB-to-5.5 dB gain variable range larger than the exemplary gain variable range shown in FIG. 1, and has a variable width dF-Gain=0.5 dB, the variable width being equivalent to the exemplary variable width shown in FIG. 1. On the other hand, the gain R-Gain of the rough-adjustment variable gain amplifier R-VGA is varied within the 0 dB-to-48 dB gain variable range and the variable width dR-Gain thereof has a value of 6 dB, as is the case with FIG. 1.

Further, as is the case with FIG. 1, the variable width dF-Gain of the fine-adjustment amplifier F-VGA is smaller than the variable width dR-Gain of the rough-adjustment amplifier R-VGA, and the variable range of the gain F-Gain of the fine-adjustment amplifier F-VGA is smaller than that of the gain R-Gain of the rough-adjustment amplifier R-VGA.

Then, each time the gain R-Gain of the rough-adjustment amplifier R-VGA is increased and/or decreased in steps of the variable width dR-Gain, the gain F-Gain of the fine-adjustment amplifier F-VGA is increased and/or decreased in steps of the fine-adjustment variable width dF-Gain within the gain variable range so that the gain control may be performed in steps of the small variable width dF-Gain over a large range including the 0 dB-to-48 dB gain variable range of the rough-adjustment amplifier R-VGA and the maximum gain 5.5 dB attained on the fine-adjustment side.

Figure 10:
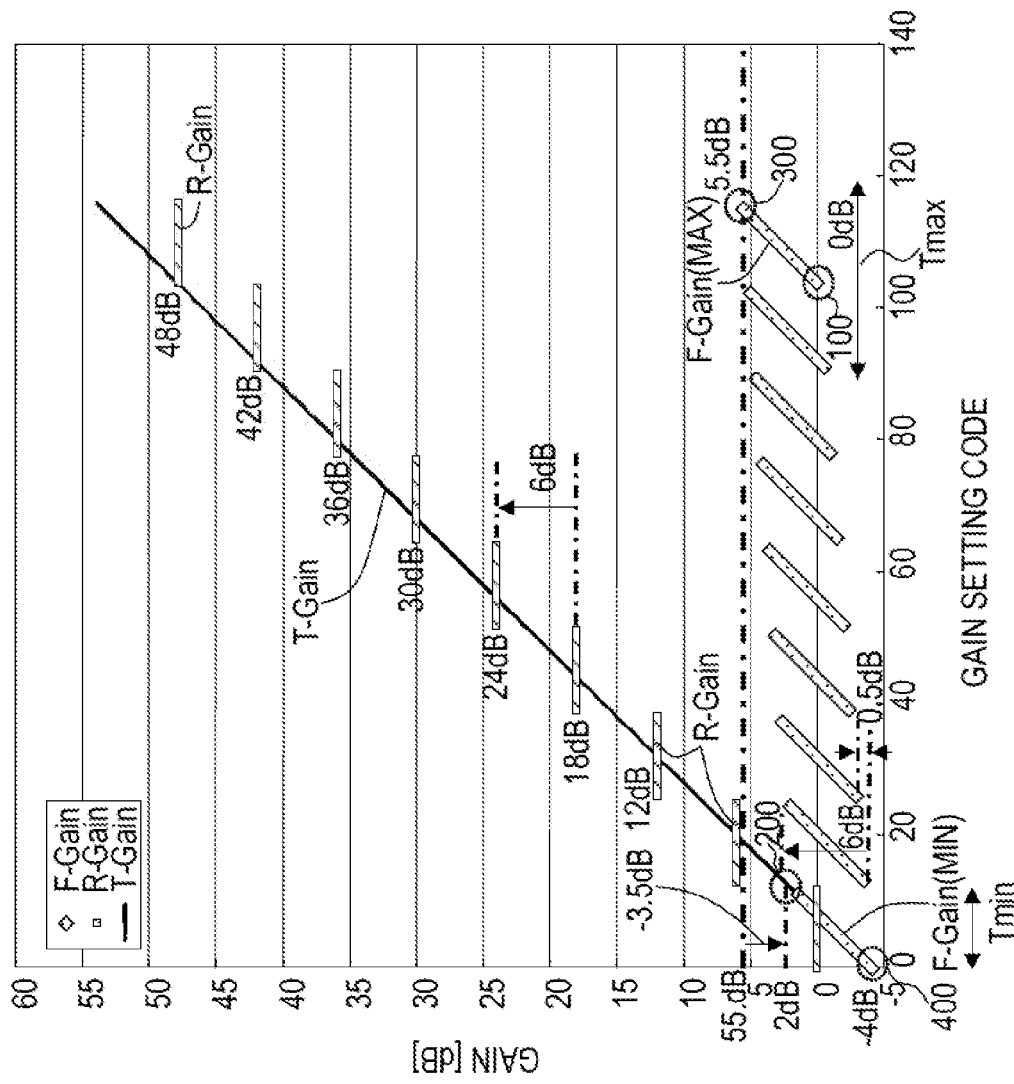
FIG. 10 illustrates a gain control characteristic according to the first embodiment.

FIG. 10 illustrates a gain control characteristic according to the first embodiment. As shown in FIG. 10, in the first embodiment, each of gain control units 14 and 16 performs control so that the maximum gain obtained within the gain variable range of the fine-adjustment amplifier F-VGA, the maximum gain being obtained when the gain of the rough-adjustment amplifier R-VGA is controlled so that the gain is minimized and/or falls within the minimum gain range Tmin (control point 200) becomes lower than the maximum gain attained within the gain variable range of the fine-adjustment amplifier F-VGA, the maximum gain being attained when the gain of the rough-adjustment amplifier R-VGA is controlled so that the gain falls within the maximum gain range Tmax (control point 300).

Namely, in the first embodiment, the fine-adjustment amplifier F-VGA shown in FIG. 4 is used, and the −4 dB-to-5.5 dB gain variable range thereof is larger than that of the amplifier shown in FIG. 3. However, since the rough-adjustment amplifier R-VGA has the variable width of 6 dB, the value of the variable width of the fine-adjustment gain F-Gain corresponding to each of the rough-adjustment gain R-Gain becomes 6 dB. That is to say, the fine-adjustment gain variable range (6 dB) matches with the rough-adjustment variable width (6 dB).

Then, the fine-adjustment gain F-Gain is varied within the −4.0 dB-to-+2.0 dB gain variable range when the rough-adjustment gain R-Gain has the minimum value of 0 dB. On the other hand, the fine-adjustment gain F-Gain is varied within the 0 dB-to-5.5 dB gain variable range when the rough-adjustment gain R-Gain has the maximum value of 48 dB so that the gain variable range becomes higher than the −4.0 dB-to-+2.0 dB gain variable range. Then, the variable range of the fine-adjustment gain F-Gain is increased by as much as 0.5 dB each time the rough-adjustment gain R-Gain is increased. On the contrary, the variable range of the fine-adjustment gain F-Gain is decreased by as much as 0.5 dB each time the rough-adjustment gain R-Gain is decreased.

The maximum fine-adjustment gain attained at the control point 200 has a value of 2.0 dB which is lower than that of the maximum fine-adjustment gain attained at the control point 300, that is, 5.5 dB, so that the minimum fine-adjustment gain of 0 dB attained at the control point 100 is sufficiently increased to such an extent that the specifications are satisfied, and the fine-adjustment maximum gain of 2.0 dB, which is attained at the control point 200, becomes lower than the exemplary gain of +5.5 dB to be compared. Consequently, it becomes possible to reduce the output amplitude of the fine-adjustment amplifier F-VGA and the gate width of the reference transistor FET0 of the rough-adjustment amplifier R-VGA, which makes it possible to reduce the gate width of each of the transistors of the rough-adjustment amplifier R-VGA and the power requirements.

The rough-adjustment amplifier R-VGA of the first embodiment has the circuit configuration shown in FIG. 2. However, since the total gain falls within the minimum gain range Tmin, that is to say, the gain of the fine-adjustment amplifier F-VGA is reduced to +2.0 dB at the control point 200, it becomes possible to reduce the amplitude of the input signal Rin and to reduce the gate width w0 of the reference transistor FET of the rough-adjustment amplifier R-VGA so that the equation w0=2 holds in place of the above-described equation w0=3. Namely, the maximum value of the fine-adjustment gain, which is attained when the total gain falls within the minimum gain range Tmin, is reduced from +5.5 dB shown in the comparison example of FIG. 6 to +2.0 dB by as much as −3.5 dB. Therefore, the current of the rough-adjustment amplifier also may be reduced to 0.67 (⅔) time as large as the absolute value of −3.5 dB.

Consequently, the gate widths w1 to w8 of the other transistors FET0 to FET8 have the individual values of 2, 4, 8, 16, 32, 64, 128, 256, and 512. Namely, when being compared to the individual values of the gate widths w1 to w8, which are illustrated in FIG. 2 as 3, 6, 12, 24, 48, 96, 192, 384, and 768, the gate width of each of the transistors is reduced to two-thirds the original width. As a result, the current consumption also may be reduced.

Figure 11:
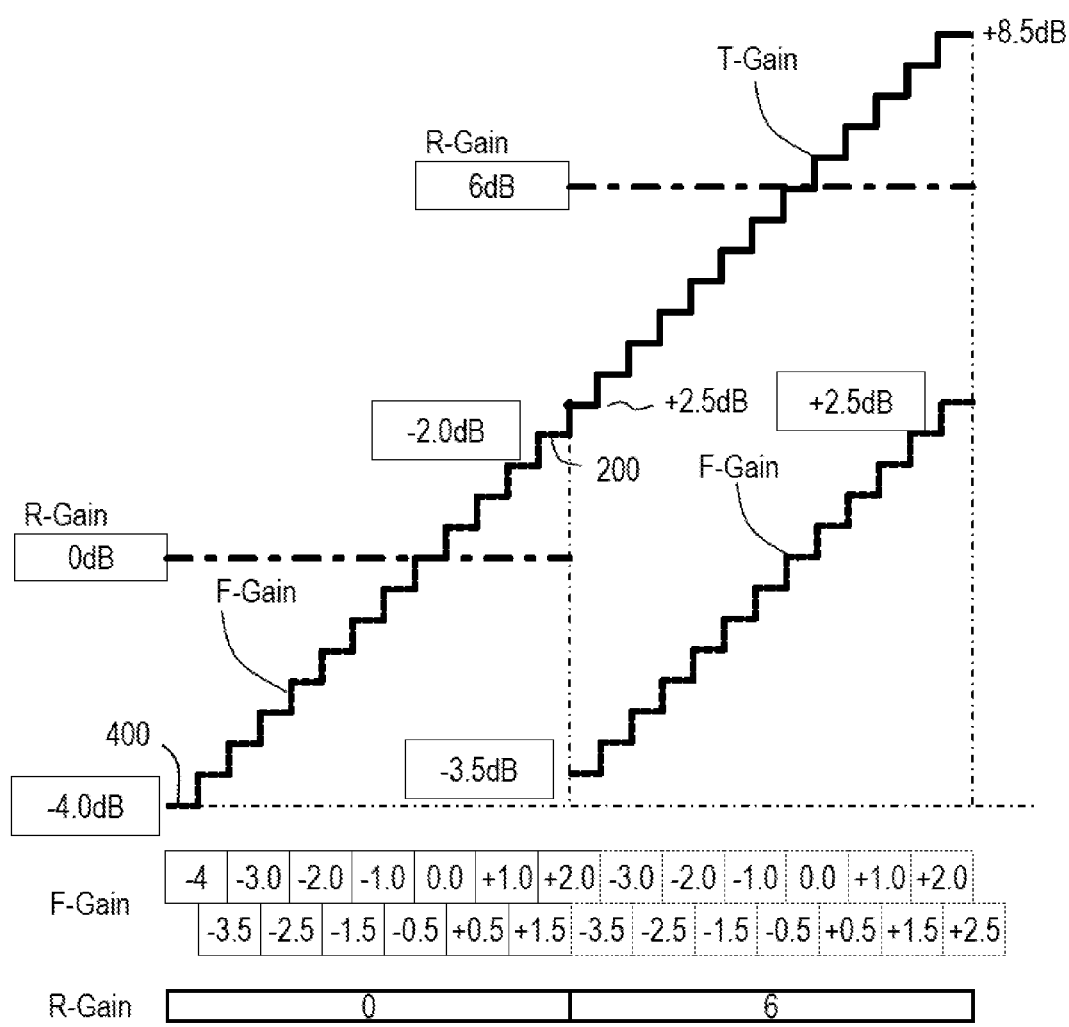
FIG. 11 illustrates the gain control characteristic shown in FIG. 10 in detail.
Figure 12:
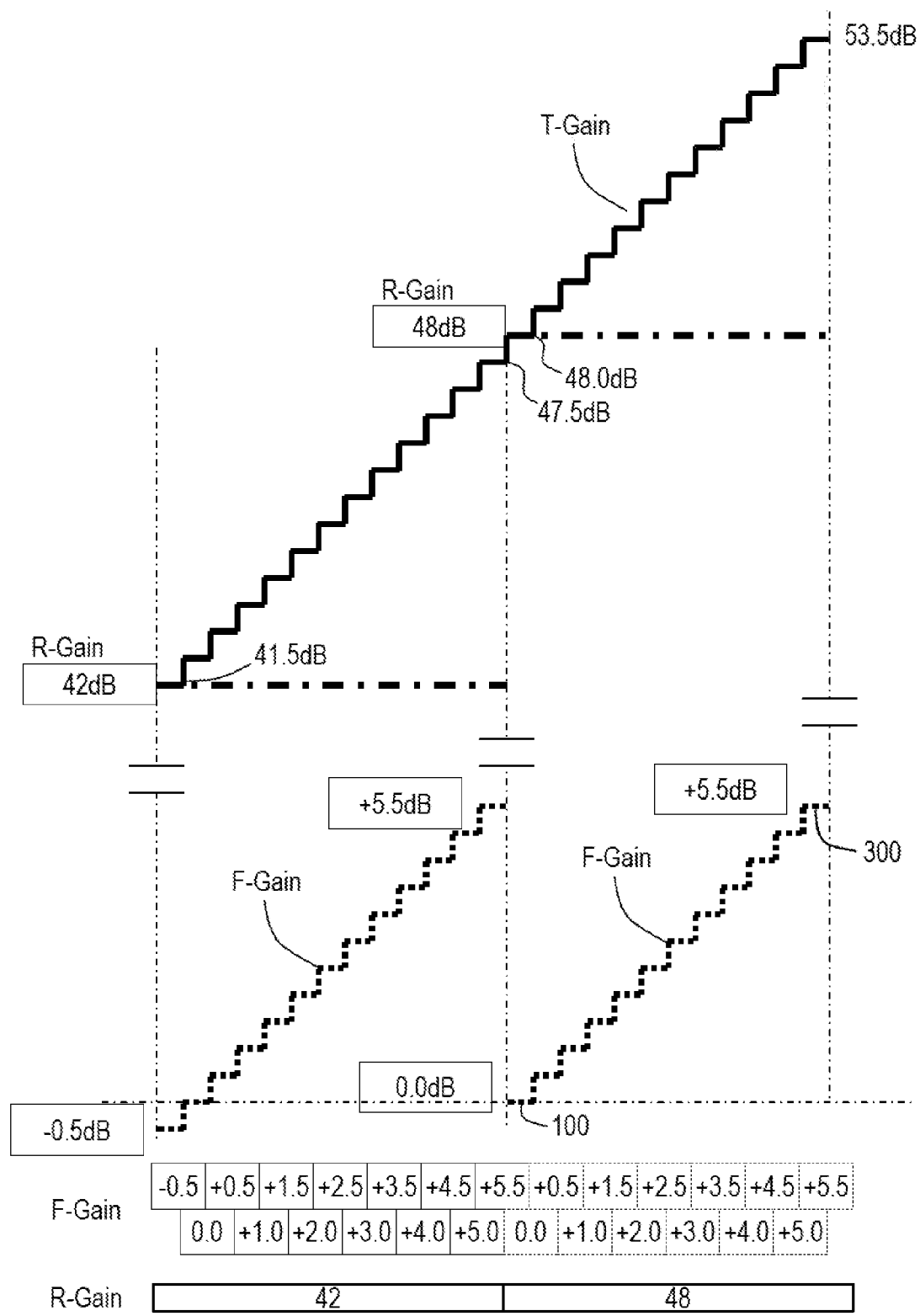
FIG. 12 illustrates the gain control characteristic shown in FIG. 10 in detail.

Each of FIGS. 11 and 12 illustrates the gain control characteristic shown in FIG. 10 in detail. In FIG. 11, the rough-adjustment gain R-Gain is controlled to have a value of 0 dB within the lowest gain variable range of from −4.0 dB to +2.0 dB, and the fine-adjustment gain F-Gain is controlled in steps of the variable width of 0.5 dB within the −4.0 dB-to-+2.0 dB gain variable range. Further, in the next lowest gain variable range of from +2.5 dB to +8.5 dB, the rough-adjustment gain R-Gain is controlled to have a value of 6 dB, and the fine-adjustment gain F-Gain is controlled in steps of the variable width of 0.5 dB within the −3.5 dB-to-+2.5 dB gain variable range. That is to say, the −3.5 dB-to-+2.5 dB gain variable range of the fine-adjustment gain F-Gain, which is attained when the equation R-Gain=6 dB holds, is higher than the −4.0 dB-to-+2.0 dB gain variable range attained when the equation R-Gain=0 dB holds by as much as 0.5 dB.

For increasing the variable range of the fine-adjustment gain F-Gain each time the rough-adjustment R-Gain is increased in the above-described manner, the variable range of 6.0 dB of the fine-adjustment gain F-Gain becomes larger than the above-described exemplary variable range of 5.5 dB to be compared by as much as 0.5 dB. Consequently, when the rough-adjustment gain R-Gain is increased from 0 dB to 6.0 dB, the fine-adjustment gain F-Gain is controlled so that the value thereof is reduced from the maximum value of +2.0 dB to the minimum value of −3.5 dB obtained in the next gain variable range. Likewise, when the rough-adjustment gain R-Gain is increased from 6.0 dB to 12.0 dB, the fine-adjustment gain F-Gain is controlled so that the value thereof is reduced from the maximum value of +2.5 dB to the minimum value of −3.0 dB obtained in the next gain variable range. When the rough-adjustment gain R-Gain is decreased, the fine-adjustment gain F-Gain is controlled by reversing the above-described procedures.

Further, in FIG. 12, the rough-adjustment gain R-Gain is controlled to have a value of 42 dB within the second highest gain variable range of from +41.5 dB to +47.5 dB, and the fine-adjustment gain F-Gain is controlled in steps of the variable width of 0.5 dB within the −0.5 dB-to-+5.5 dB gain variable range. Further, in the highest gain variable range of from +48.0 dB to +53.5 dB, the rough-adjustment gain R-Gain is controlled to have a value of 48 dB, and the fine-adjustment gain F-Gain is controlled in steps of the variable width of 0.5 dB within the 0.0 dB-to-+5.5 dB gain variable range.

In that case, the variable range of the fine-adjustment gain F-Gain is increased each time the rough-adjustment R-Gain is increased. Further, when the rough-adjustment gain R-Gain is increased from 42 dB to 48 dB, the fine-adjustment gain F-Gain is controlled so that the value thereof is reduced from the maximum value of +5.5 dB to the minimum value of 0.0 dB obtained within the next gain variable range.

In FIG. 12, the output circuit outputs the maximum power when any of gains attainable within the maximum gain range Tmax shown in FIG. 10 is attained. Then, as indicated by the control point 100, the minimum value of the fine-adjustment gain F-Gain attained within the maximum gain range Tmax is 0.0 dB (when the equation R-Gain=48 dB holds) and/or −0.5 dB (when the equation R-Gain=42 dB holds), and the fine-adjustment gain F-Gain is increased to such an extent that the standard of the CN ratio of the output signal is satisfied.

On the other hand, in FIG. 11, control is performed so that the maximum value of the fine-adjustment gain F-Gain, which is attained when the rough-adjustment gain R-Gain has the maximum value of 0 dB at the control point 200, is reduced to +2.0 dB, and the maximum value of the fine-adjustment gain F-Gain, which is attained when the next rough-adjustment gain R-Gain has the minimum value of 6 dB, is reduced to +2.5 dB. Consequently, it becomes possible to reduce the input amplitude of the rough-adjustment amplifier R-VGA and the size of the reference transistor of the rough-adjustment amplifier so that the current consumption is reduced. Likewise, control is performed so that the maximum value of the fine-adjustment gain F-Gain, which is attained when the rough-adjustment gain R-Gain has a value of 6 dB, is reduced to +2.5 dB. Thus, the reduction of the maximum value of the fine-adjustment gain F-Gain attained when the total gain falls within the minimum gain range Tmin allows for reducing the channel size of each of the transistors of the rough-adjustment amplifier R-VGA.

According to the first embodiment, the variable range of the fine-adjustment gain F-Gain is increased by as much as 0.5 dB each time the value of the rough-adjustment gain R-Gain is increased from the minimum value to the maximum value. As a result, the minimum value of the fine-adjustment gain attained when the total gain T-Gain falls within the maximum gain range Tmax (e.g., when the equation R-Gain=42 dB and/or 48 dB holds) is sufficiently increased, and the maximum value of the fine-adjustment gain attained when the total gain T-Gain falls within the minimum gain range Tmin (e.g., when the equation R-Gain=0 dB and/or 6 dB holds) is reduced to a low value.

However, for increasing the minimum value of the fine-adjustment gain attained when the total gain T-Gain falls within the maximum gain range Tmax to a sufficiently high value, as indicated by the control point 100, and decreasing the maximum value of the fine-adjustment gain attained when the total gain T-Gain falls within the minimum gain range Tmin to a low value, as indicated by the control point 200, the variable range of the fine-adjustment gain F-Gain may not necessarily be increased by as much as 0.5 dB each time the rough-adjustment gain R-Gain is increased. Therefore, the gain control performed in a second embodiment of the present invention will be described as below.

Second Embodiment

Figure 13:
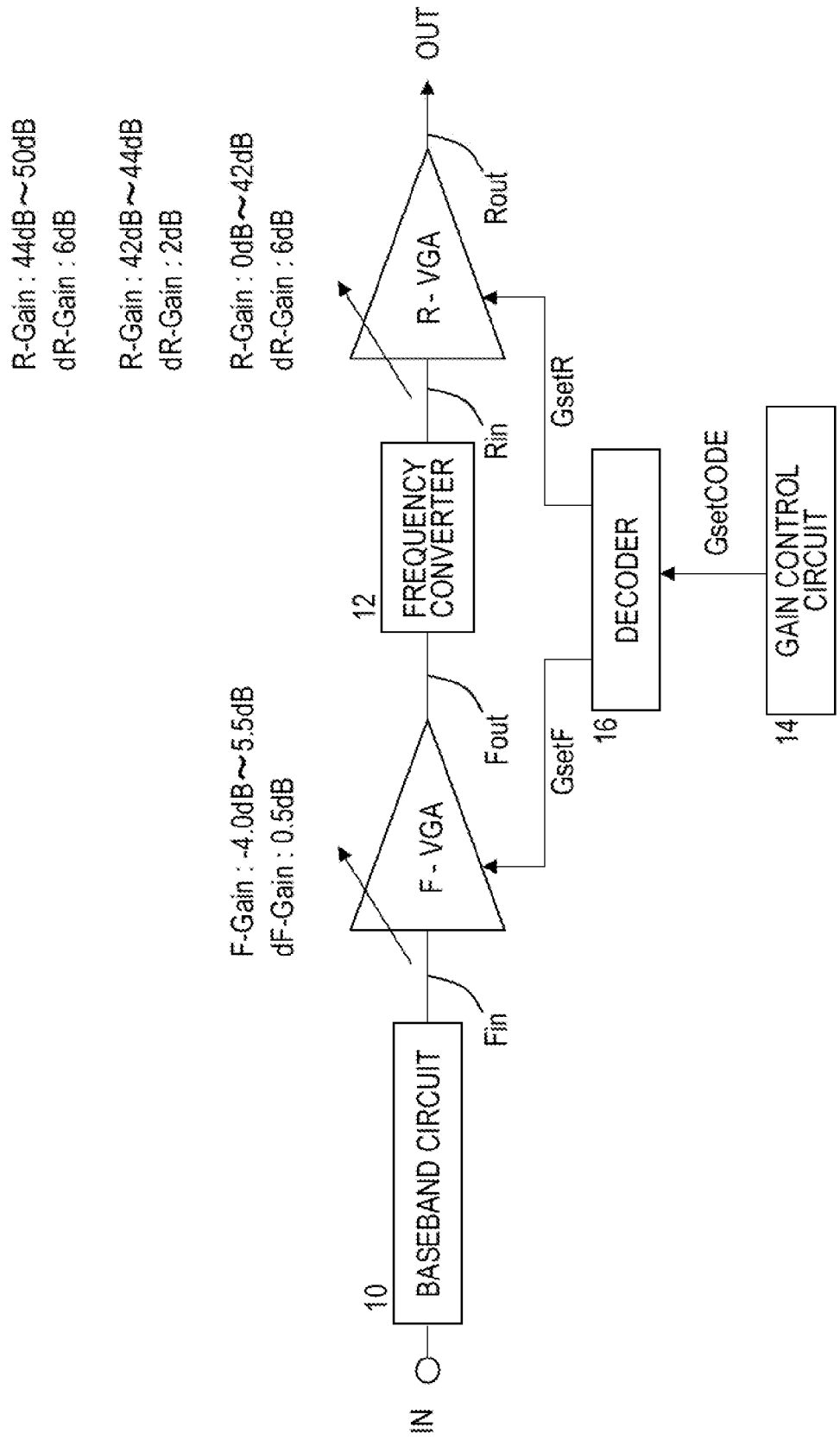
FIG. 13 illustrates an output circuit of a RF transmitter according to a second embodiment of the present invention.

FIG. 13 illustrates an output circuit of a RF transmitter according to the second embodiment. As is the case with FIGS. 1 and 9, the above-described output circuit includes the baseband circuit 10, the fine-adjustment variable gain amplifier F-VGA, the frequency converter 12, and the rough-adjustment variable gain amplifier R-VGA. Further, the output circuit includes the gain control circuit 14 configured to output the gain setting code GsetCODE, and the decoder 16 configured to decode the gain setting code GsetCODE and to output the gain setting signals GsetF and GsetR to the two amplifiers F-VGA and R-VGA individually.

According to the example shown in FIG. 13, the gain F-Gain shown for the fine-adjustment variable gain amplifier F-VGA is varied within the −4 dB-to-5.5 dB gain variable range which is larger than the exemplary gain variable range shown in FIG. 1, and the variable width thereof is shown as the equation dF-Gain=0.5 dB, as is the case with FIG. 1. On the other hand, the gain R-Gain of the rough-adjustment variable gain amplifier R-VGA is varied within the 0 dB-to-50 dB gain variable range, the value of the variable width dR-Gain is 6 dB within the 0 dB-to-42 dB gain variable range, and the gain higher than the R-Gain having a value of 42 dB by as much as a single level has a value of 44 dB so that the variable width therebetween is as small as 2 dB. Further, the variable width dR-Gain attained within the 44 dB-to-50 dB gain variable range has a value of 6 dB.

Further, as is the case with FIGS. 1 and 9, the variable width dF-Gain of the fine-adjustment amplifier F-VGA is smaller than the variable width dR-Gain of the rough-adjustment amplifier R-VGA, and the gain variable range of the gain F-Gain of the fine-adjustment amplifier F-VGA is smaller than that of the gain R-Gain of the rough-adjustment amplifier R-VGA. Further, each time the gain R-Gain of the rough-adjustment amplifier R-VGA is increased and/or decreased in steps of the variable width dR-Gain, the gain F-Gain of the fine-adjustment amplifier F-VGA is increased and/or decreased in steps of the fine-adjustment variable width dF-Gain within the gain variable range so that the gain control can be performed in steps of the small variable width dF-Gain over a large range including the 0 dB-to-50 dB gain variable range of the rough-adjustment amplifier R-VGA and the maximum gain 5.5 dB attained on the fine-adjustment side.

Figure 14:
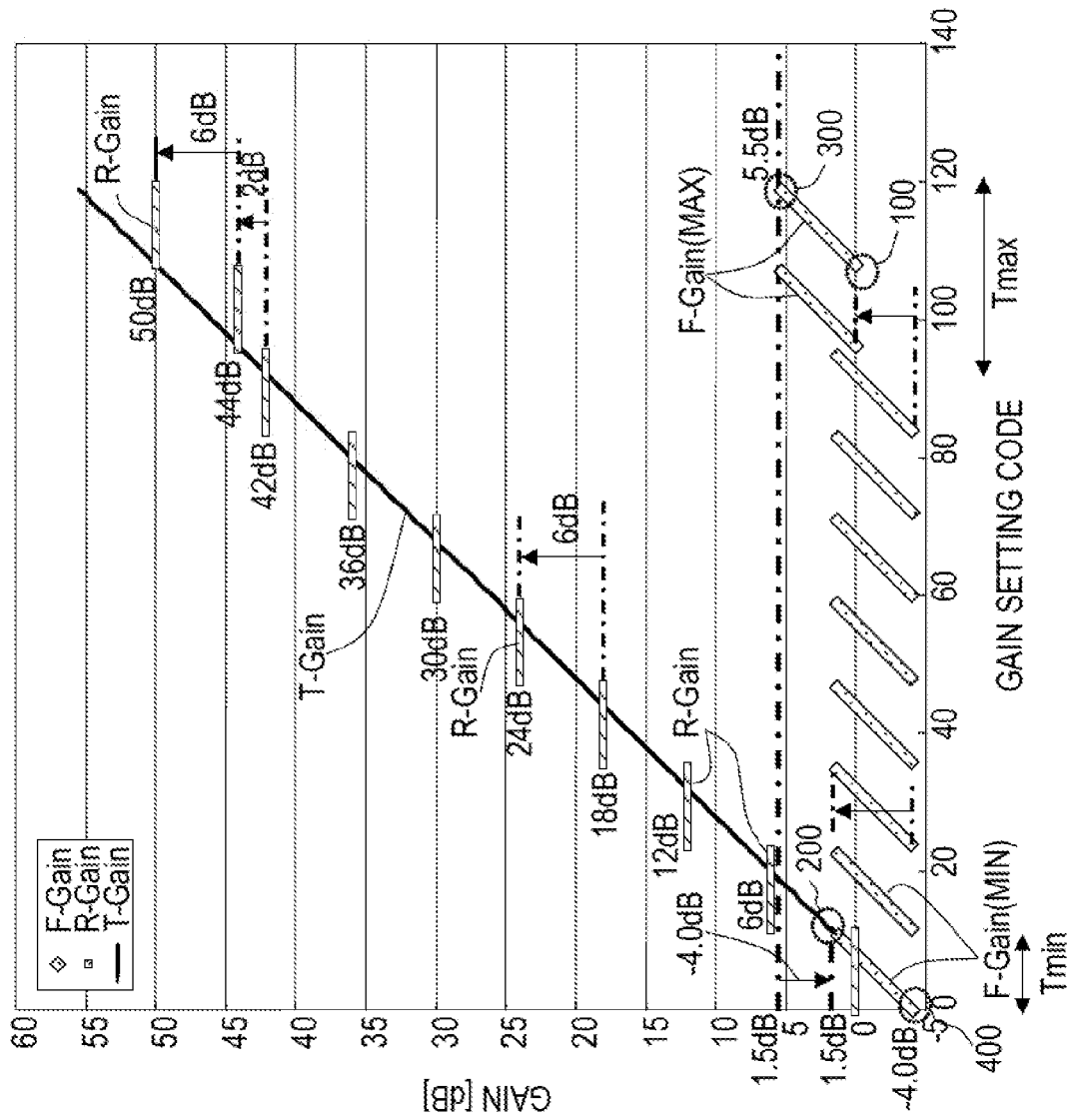
FIG. 14 illustrates a gain control characteristic according to the second embodiment.

FIG. 14 illustrates a gain control characteristic according to the second embodiment. As shown in FIG. 14, in the second embodiment, each of the gain control units 14 and 16 also performs control so that the maximum gain obtained within the gain variable range of the fine-adjustment amplifier F-VGA, the maximum gain being obtained when the gain of the rough-adjustment amplifier R-VGA is controlled so that the gain is minimized and/or falls within the minimum gain range Tmin (e.g., the control point 200) becomes lower than the maximum gain attained within the gain variable range of the fine-adjustment amplifier F-VGA, the maximum gain being attained when the gain of the rough-adjustment amplifier R-VGA is controlled so that the gain falls within the maximum gain range Tmax (e.g., the control point 300).

The fine-adjustment amplifier F-VGA shown in FIG. 4 is also used in the second embodiment, and the −4 dB-to-5.5 dB gain variable range thereof is larger than that of the amplifier shown in FIG. 3. On the other hand, since the rough-adjustment amplifier R-VGA has the variable width of 6 dB, the value of the variable range of the fine-adjustment gain F-Gain corresponding to each of the rough-adjustment gains R-Gain becomes 5.5 dB. That is to say, the fine-adjustment gain variable range (5.5 dB) matches with the rough-adjustment variable width (65 dB).

Then, the fine-adjustment gain F-Gain is varied within the −4.0 dB-to-+1.5 dB gain variable range when the rough-adjustment gain R-Gain has the minimum value of 0 dB. On the other hand, the fine-adjustment gain F-Gain is varied within the 0 dB-to-5.5 dB gain variable range when the rough-adjustment gain R-Gain has the maximum value of 50 dB and the second maximum value of 44 dB so that the gain variable range becomes higher than the −4.0 dB-to-+1.5 dB gain variable range. Then, while the rough-adjustment gain R-Gain falls within the 0 dB-to-42 dB range, the −4.0 dB-to-+1.5 dB variable range of the fine-adjustment gain F-Gain is kept substantially constant, and when the rough-adjustment gain R-Gain is increased from 42 dB to 44 dB, the variable range of the fine-adjustment gain F-Gain is increased from the −4.0 dB-to-+1.5 dB range to the 0.0 dB-to-+5.5 dB range. On the contrary, when the rough-adjustment gain R-Gain is decreased from 44 dB to 42 dB, the variable range of the fine-adjustment gain F-Gain is decreased from the 0.0 dB-to-+5.5 dB range to the −4.0 dB-to-+1.5 dB range.

The change point of the rough-adjustment gain, which changes the variable range of the above-described fine-adjustment gain, may not necessarily be 42 dB and/or 44 dB. That is to say, the change point of the rough-adjustment gain may have any value so long as the value of the total gain becomes higher than the minimum gain range Tmin (the range indicated by the expression R-Gain=0 dB and/or 6 dB) and becomes lower than maximum gain range Tmax (the range indicated by the expression R-Gain=44 dB and/or 50 dB). It is preferable that the change point of the rough-adjustment gain should have the highest possible value lower than the maximum gain range Tmax where the maximum output power is attained as shown in FIG. 14. Consequently, even though the transistor size of the rough-adjustment amplifier R-VGA is reduced, the rough-adjustment amplifier R-VGA may amplify an input signal without a distortion, the input signal being transmitted when the fine-adjustment gain is maximized.

In FIG. 14, the maximum fine-adjustment gain attained at the control point 200 specified within the minimum gain range Tmin has a value of 1.5 dB which is smaller than the value of the maximum fine-adjustment gain attained at the control point 300, that is, 5.5 dB. Consequently, the value of the minimum fine-adjustment gain attained at the control point 100 specified within the maximum gain range Tmax is increased to 0 dB which is sufficiently high enough to satisfy the standard.

Consequently, it becomes possible to reduce the gate width of the reference transistor FET0 of the rough-adjustment amplifier R-VGA, which makes it possible to reduce the gate width of each of the transistors of the rough-adjustment amplifier R-VGA and the power requirements. The gate widths w0 to w8 of the individual transistors of the rough-adjustment amplifier R-VGA can be reduced as in the first embodiment.

Figure 15:
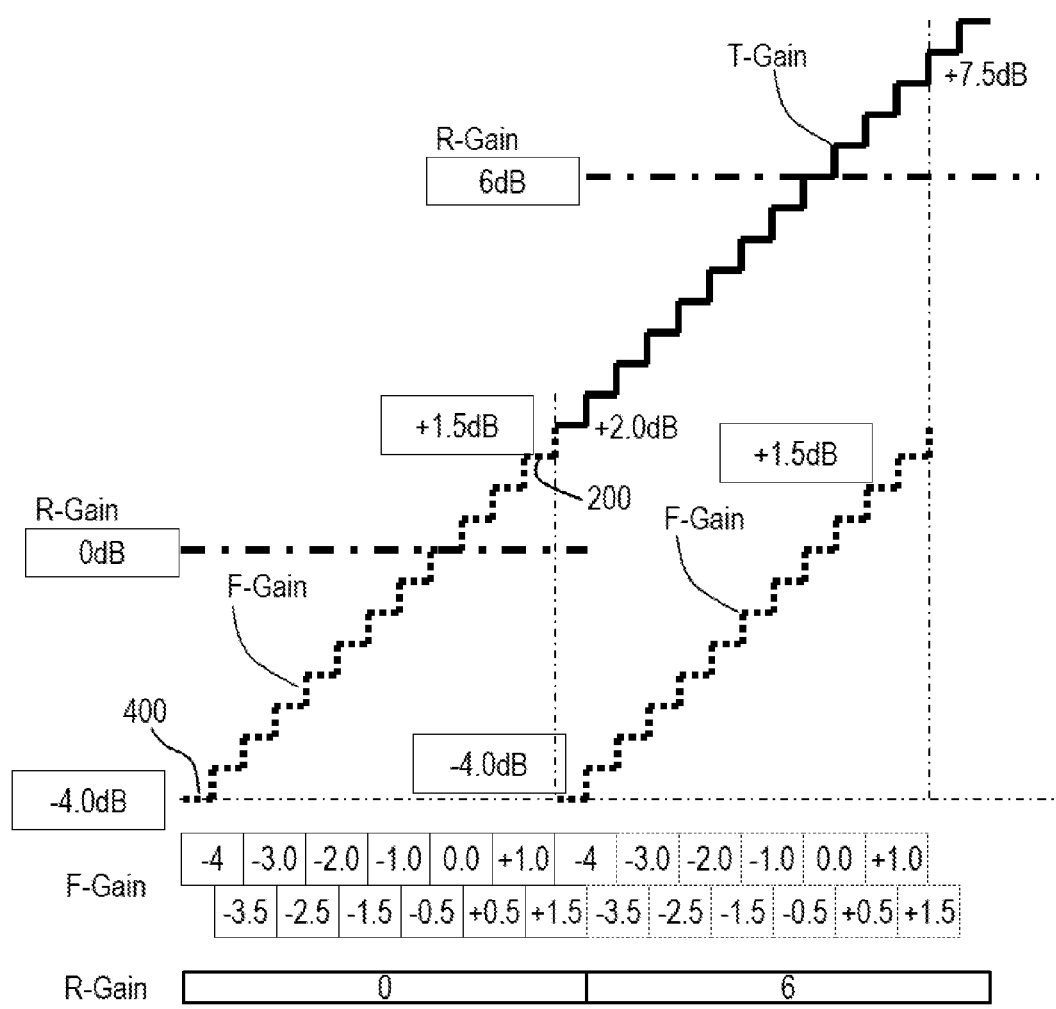
FIG. 15 illustrates the gain control characteristic shown in FIG. 14 in detail.
Figure 16:
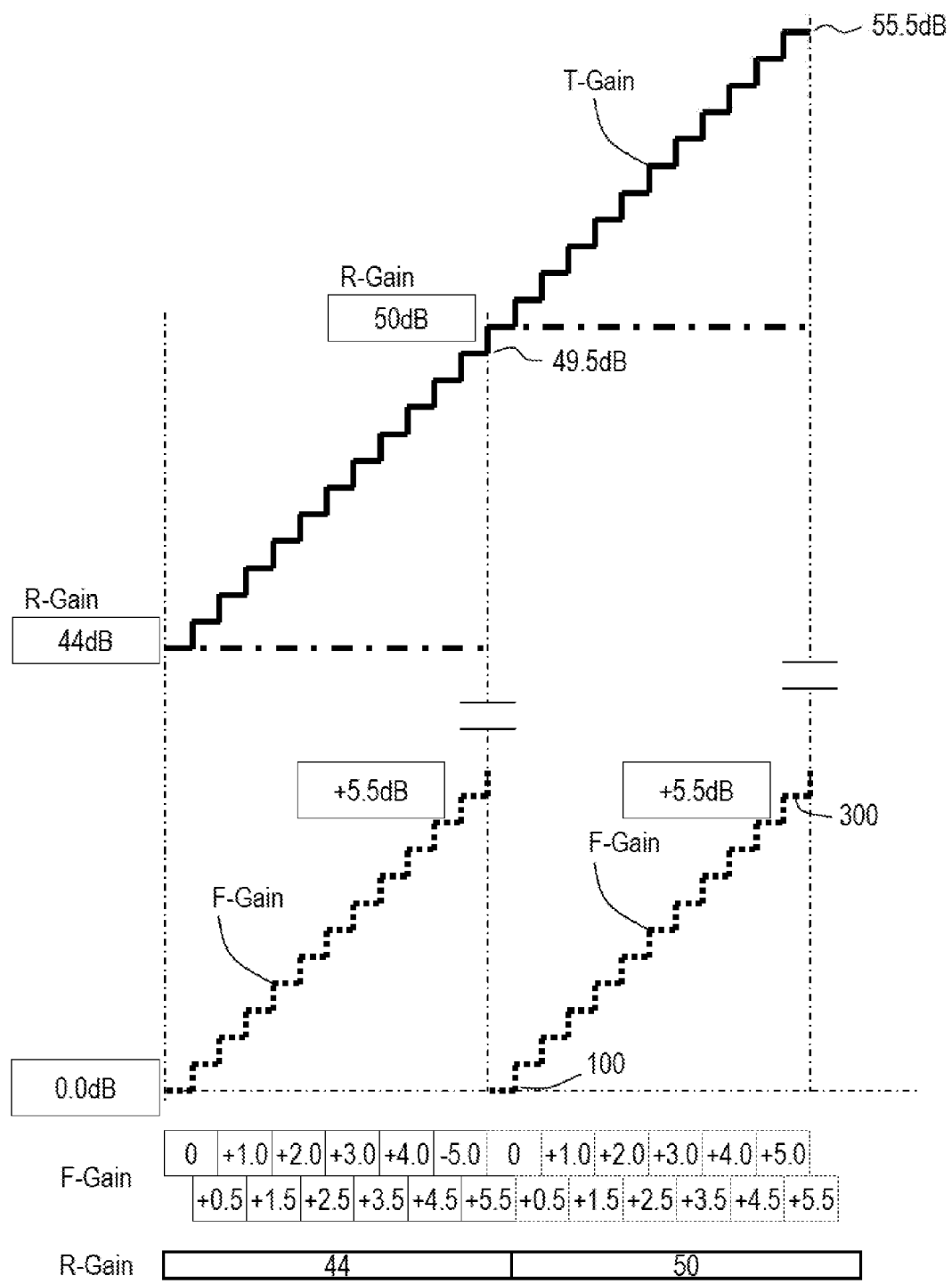
FIG. 16 illustrates the gain control characteristic shown in FIG. 14 in detail.

Each of FIGS. 15 and 16 illustrates the gain control characteristic shown in FIG. 14 in detail. In FIG. 15, the rough-adjustment gain R-Gain is controlled to have a value of 0 dB within the lowest gain variable range of from −4.0 dB to +2.0 dB, and the fine-adjustment gain F-Gain is controlled in steps of the variable width of 0.5 dB within the −4.0 dB-to-+1.5 dB gain variable range. Further, in the next lowest gain variable range of from +2.0 dB to +7.5 dB, the rough-adjustment gain R-Gain is controlled to have a value of 6 dB, and the fine-adjustment gain F-Gain is controlled in steps of the variable width of 0.5 dB within the −4.0 dB-to-+1.5 dB gain variable range. Namely, the fine-adjustment gain F-Gain is varied within the −4.0 dB-to-+1.5 dB gain variable range when the value of the rough-adjustment gain R-Gain is either 0 dB or 6 dB. The −4.0 dB-to-+1.5 dB variable range of the fine-adjustment gain remains substantially the same when the rough-adjustment gain R-Gain has any value attained within the 0 dB-to-42.0 dB range.

On the other hand, in FIG. 16, the rough-adjustment gain R-Gain is controlled to have a value of +44.0 dB within the +44.0 dB-to-+49.5 dB gain variable range, and the fine-adjustment gain F-Gain is controlled in steps of the variable width of 0.5 dB within the 0.0 dB-to-+5.5 dB gain variable range. Further, in the highest gain variable range of from +50.0 dB to +55.5 dB, the rough-adjustment gain R-Gain is controlled to have a value of 50 dB, and the fine-adjustment gain F-Gain is controlled in steps of the variable width of 0.5 dB within the 0.0 dB-to-+5.5 dB gain variable range. Namely, the −0.0 dB-to-+5.5 dB variable range of the fine-adjustment gain F-Gain remains substantially the same when the value of the rough-adjustment gain R-Gain is either 44 dB or 50 dB.

However, when the value of the rough-adjustment gain R-Gain is increased from 42.0 dB to 44.0 dB, the variable range of the fine-adjustment gain F-Gain is changed from the −4.0 dB-to-+1.5 dB range to the 0.0 dB-to-+5.5 dB range. When the value of the rough-adjustment gain R-Gain is decreased from 44.0 dB to 42.0 dB, the variable range of the fine-adjustment gain is changed the other way around.

Thus, in the second embodiment, the minimum value of the fine-adjustment gain F-Gain attained when the total gain T-Gain falls within the maximum gain range Tmax (e.g., when the equation R-Gain=44 dB and/or 50 dB holds) is sufficiently increased to 0 dB, and the maximum value of the fine-adjustment gain attained when the total gain T-Gain falls within the minimum gain range Tmin (e.g., when the equation R-Gain=0 dB and/or 6 dB holds) is reduced to a value as low as +1.5 dB.

In each of the first and second embodiments, the width of the variable range of the fine-adjustment gain remains invariant for all or almost all of the rough-adjustment gains R-Gain. However, the width of the variable range of the fine-adjustment gain may not necessarily be kept constant for a plurality of gains of the rough-adjustment variable gain amplifier. Then, if the width of the variable range of the fine-adjustment gain is varied, the variable width of the rough-adjustment amplifier is determined based on the varied width.

Likewise, the variable width of the rough-adjustment gain may not necessarily be kept constant at a value of 6 dB for substantially the same reason as that described above.

However, when designing the circuit configuration of the rough-adjustment amplifier R-VGA so that the gain is controlled by controlling the gate width of each of the transistors that are shown in FIG. 2, the gate width is increased by 2 times, 4 times, 8 times, and 2-to-the n-th power times, for example. Consequently, the circuit configuration is simplified and characteristic variations caused by process variations are reduced. In that case, it is preferable that the value of the variable width dR-Gain of the rough-adjustment gain R-Gain should be fixed to 6 dB.

All examples and conditional language recited herein are intended for pedagogical purposes to aid the reader in understanding the principles of the invention and the concepts contributed by the inventor to furthering the art, and are to be construed as being without limitation to such specifically recited examples and conditions. Although the embodiments of the present inventions have been described in detail, it should be understood that the various changes, substitutions, and alterations could be made hereto without departing from the spirit and scope of the invention.

The invention claimed is:

1. An output circuit of a radio-frequency (RF) transmitter comprising:
   a first variable gain amplifier configured to have a first variable gain within a first gain variable range based on a first variable width and to amplify an input signal;
   a second variable gain amplifier configured to amplify a signal provided from an output of the first variable gain amplifier and to have a second variable gain within a second gain variable range larger than the first gain variable range based on a second variable width larger than the first variable width; and
   a gain control unit configured to fluctuate the second variable gain in steps of the second variable width in response to fluctuations of the first variable gain, the fluctuations of the first variable gain being attained within the first gain variable range,
   wherein the first gain variable range corresponds to the second variable width,
   wherein the first gain variable range is larger than the second gain variable range, and
   wherein the gain control unit performs control so that a minimum gain within the first gain variable range is increased by a value of the first variable width each time that the second variable gain increases.

2. The output circuit of the RF transmitter according to claim 1,
   wherein the first gain variable range corresponds to the second variable width,
   wherein the first gain variable range is larger than the second gain variable range, and
   wherein the gain control unit performs control so that the first gain variable range, as attained when the second variable gain is controlled to be at minimum, becomes lower than the first gain variable range as attained when the second variable gain is controlled to be at maximum.

3. The output circuit of the RF transmitter according to claim 2, wherein when fluctuating the second variable gain, the gain control unit fluctuates a level of the first gain variable range.

4. The output circuit of the RF transmitter according to claim 2, wherein when fluctuating the second variable gain based on the second variable width, the gain control unit fluctuates a level of the first gain variable range based on at least one from a group consisting of the first variable width and a variable width larger than the first variable width.

5. The output circuit of the RF transmitter according to claim 2, wherein the gain control unit fluctuates a level of the first gain variable range of the first variable gain amplifier in any case where the second variable gain is fluctuated.

6. The output circuit of the RF transmitter according to claim 2, wherein when fluctuating the second variable gain from a first intermediate gain other than the minimum gain and the maximum gain to a second intermediate gain, the gain control unit fluctuates a level of the first gain variable range of the first variable gain amplifier.

7. The output circuit of the RF transmitter according to claim 1, wherein the second variable gain amplifier includes source grounding transistors that are connected in parallel with each other, where a second frequency signal is input to gates of the source grounding transistors and an output signal is generated in a load circuit provided on drain sides of the source grounding transistors, and
   wherein the gain control unit controls presence or absence of a supply of a gate bias voltage to each of the gates, increases a number of the source grounding transistors to which the gate bias voltages are supplied so that the second variable gain is increased, and decreases a number of the source grounding transistors to which the gate bias voltages are supplied so that the second variable gain is decreased.

8. The output circuit of the RF transmitter according to claim 7, wherein the second variable gain amplifier includes first switches each configured to supply the gate bias voltage to the gate of an associated one of the source grounding transistors and second switches, each configured to supply a voltage other than the gate bias voltage to the gate of an associated one the source grounding transistors, and wherein the gain control unit increases a number of the source grounding transistors that are in an enabled state where the associated first switch is turned on and the associated second switch is turned off so that the gain is increased and increases a number of the source grounding transistors that are in a disabled state where the associated first switch is turned off and the associated second switch is turned on so that the gain is decreased.

9. The output circuit of the RF transmitter according to claim 3, wherein, the second variable width is determined based on a fluctuation width of the level of the first gain variable range.

10. The output circuit of the RF transmitter according to claim 4, wherein, the second variable width is determined based on a fluctuation width of the level of the first gain variable range.

11. An output circuit of a radio-frequency (RF) transmitter comprising:

a first variable gain amplifier configured to have a first variable gain within a first gain variable range based on a first variable width and to amplify an input signal;

a second variable gain amplifier configured to amplify a signal provided from an output of the first variable gain amplifier and to have a second variable gain within a second gain variable range larger than the first gain variable range based on a second variable width larger than the first variable width; and a gain control unit configured to fluctuate the second variable gain in steps of the second variable width in response to fluctuations of the first variable gain, the fluctuations of the first variable gain being attained within the first gain variable range, wherein the gain control unit performs control so that a maximum gain attained within the first gain variable range for the first variable gain when the second variable gain is controlled to be at minimum becomes lower than a maximum gain attained within the first gain variable range for the first variable gain when the second variable gain is controlled to be at maximum, and wherein the first variable gain amplifier includes input resistors and switches, the input resistors being configured to perform resistor division for the input signal, an operational amplifier configured to amplify a signal obtained through the resistor division performed by the input resistors, and the switches being provided between a resistor division node of the input resistors and an input of the operational amplifier, and wherein the gain control unit fluctuates and controls the first gain by performing on-off control for the switches.

* * * * *